United States Patent
Nikolaidis

(10) Patent No.: US 11,337,313 B2
(45) Date of Patent: May 17, 2022

(54) ELECTRICAL CONTACT BETWEEN ELECTRICALLY CONDUCTING POLYMER COATED WIRES AND ELECTRICALLY CONDUCTING SUBSTRATES USING WIRE BONDING

(71) Applicant: Heraeus Deutschland GmbH & Co. KG, Hanau (DE)

(72) Inventor: Ilias Nikolaidis, Frankfurt (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 0 days.

(21) Appl. No.: 17/001,350

(22) Filed: Aug. 24, 2020

(65) Prior Publication Data

US 2021/0075127 A1    Mar. 11, 2021

Related U.S. Application Data

(60) Provisional application No. 62/897,875, filed on Sep. 9, 2019.

(51) Int. Cl.
*H05K 3/32* (2006.01)

(52) U.S. Cl.
CPC .................................. *H05K 3/325* (2013.01)

(58) Field of Classification Search
CPC ............................................ H05K 2201/10356
See application file for complete search history.

(56) References Cited

U.S. PATENT DOCUMENTS

| 4,950,866 | A | 8/1990 | Kojima et al. |
| 6,372,990 | B1 | 4/2002 | Saito et al. |
| 6,647,635 | B1 | 11/2003 | Banfield |
| 2006/0022775 | A1 | 2/2006 | Greeley |
| 2007/0239246 | A1 | 10/2007 | Camps et al. |
| 2011/0071596 | A1 | 3/2011 | Kara et al. |
| 2011/0079423 | A1 | 4/2011 | Zhao et al. |
| 2011/0125240 | A1 | 5/2011 | Zhao et al. |
| 2013/0094161 | A1 | 4/2013 | Ochi et al. |
| 2015/0289788 | A1 | 10/2015 | Simpson et al. |
| 2017/0100126 | A1 | 4/2017 | Bowman et al. |
| 2019/0038294 | A1 | 2/2019 | Tieu et al. |

FOREIGN PATENT DOCUMENTS

| EP | 2695638 A2 | 2/2014 |
| JP | 2010277774 A | 12/2010 |
| JP | 2019096506 A | 6/2019 |

OTHER PUBLICATIONS

Guide to Modern Wedge Bonding, Understanding the Basics of Today's Wedge Bonding Materials, Processes, and Applications, Palomar Technologies, 2004, 24 pages.
Harman, Wire Bonding in Microelectronics, McGraw Hill, Third Edition, 2010, 21 pages.
Suganuma, Interconnection Technologies, Wide Bandgap Power Semiconductor Packaging, 2018, 24 pages.

*Primary Examiner* — Ross N Gushi
(74) *Attorney, Agent, or Firm* — Blank Rome LLP

(57) ABSTRACT

In general, the present invention relates to electrically conducting, polymer coated wires that are in electric contact with, as well as touching, electrically conducting substrates. In particular, the present invention relates to a connection unit for achieving the aforementioned electric connection and touching, as well as a method for producing said connection unit. The present invention also relates to a use for such a connection unit.

18 Claims, 12 Drawing Sheets

600

604

608

ELECTRICAL CONTACT BETWEEN ELECTRICALLY CONDUCTING POLYMER COATED WIRES AND ELECTRICALLY CONDUCTING SUBSTRATES USING WIRE BONDING

CROSS REFERENCE TO RELATED APPLICATION

This application claims the benefit of priority under 35 USC § 119(e) to U.S. Provisional Patent Application Ser. No. 62/897,875, filed Sep. 9, 2019; which is incorporated herein by reference in its entirety.

FIELD OF THE INVENTION

In general, the present invention relates to electrically conducting, polymer coated wires that are in electric contact with, as well as touching, electrically conducting substrates. In particular, the present invention relates to a connection unit for achieving the aforementioned electric connection and touching, as well as a method for producing said connection unit. In particular, the present invention also relates to a use for such a connection unit.

BACKGROUND

Connection units comprising electrically conducting, polymer coated wires that are in electrical contact with, as well as touching, electrically conducting substrates are used in a variety of electronic devices. A number of these electronic devices are in the field of diagnostic medicine, and examples include glucose monitors and electroencephalogram devices. Further examples include using connection units for computer microchips.

U.S. Pat. No. 4,950,866 discloses how to electrically connect an electrically conducting wire with an electrically conducting substrate. The object of this disclosure is electrically conducting wires that have an electrically conducting inner core and an electrically insulating outer layer. The disclosure teaches to heat a first end of the conducting wire, thereby melting the insulating layer at the first end. The inner core is thus exposed at the first end, and it is possible to achieve the electrical connection between the conducting wire and the substrate by first touching the first end to the substrate, and then applying pressure to the first end.

Generally, electrically conducting polymer coated wires are electrically connected to electrically conducting substrates using conducting adhesives or low temperature solders. EP 2 695 638 A2 teaches that the electrical connection can be achieved by using soldering, brazing, welding, laser bonding, or conductive adhesive.

The efforts of producing the connection units is adversely affected when employing soldering, welding or the like. This especially applies if a curing step is required after the welding, soldering, or the like step. As a result, the use of these connection units is limited because of poor electronic and mechanical properties. If one intends to improve these properties, very complex, and often quite energy consuming, production operations have to be undertaken.

OBJECTS OF THE INVENTION

An object of the present invention is to at least partially overcome one or more of the disadvantages present in the state of the art.

It is a further object of the invention to provide a connection unit that has an improved electrical conductivity.

It is a further object of the invention to provide a connection unit wherein a conducting wire has an undamaged, electrically conducting and organic outer layer.

It is a further object of the invention to provide a connection unit that lead to more reliable measuring results when the connection unit is used in a medical device.

It is a further object of the invention to provide a connection unit that has an improved durability. It is a further object of the invention to provide a method for producing a connection unit without damaging an electrically conducting and organic outer layer of a conducting wire.

It is a further object of the invention to provide a method for reducing the time needed to produce a connection unit.

It is a further object of the invention to provide a method that reduces the complexity of producing a connection unit.

It is a further object of the invention to provide a method that reduces the energy needed in producing a connection unit.

It is a further object of the invention to provide a method that reduces the amount of materials needed in producing a connection unit.

PREFERRED EMBODIMENTS OF THE INVENTION

A contribution to at least partially fulfilling at least one of the above-mentioned objects is made by the independent embodiments. The dependent embodiments provide preferred embodiments which contribute to at least partially fulfilling at least one of the objects.

|1| A connection unit comprising
   a.) a substrate, wherein the substrate comprises
      i. an insulating layer that is electrically insulating,
      ii. a first conducting region that is electrically conducting;
   b.) a first positioning wire;
   c.) a conducting wire, wherein
      i. the conducting wire comprises a first longitudinal portion,
      ii. in a first cross-sectional cut of the first longitudinal portion, the first cross-sectional cut comprises the following layers, in this order:
         A) an outer layer that is electrically conducting,
         B) an intermediate layer that is electrically insulating,
         C) an inner metal core that is electrically conducting,
         D) the intermediate layer,
         E) the outer layer;
      iii. the first longitudinal portion is located between the substrate and the first positioning wire, such that
         A) the first longitudinal portion at least partially overlaps the first conducting region,
         B) the first positioning wire is arranged transverse to the first longitudinal portion,
         C) the first longitudinal portion is in electrical contact with both, and touches both
            I. the first conducting region, and
            II. the first positioning wire;
   and
   wherein, in a second cross-sectional cut of the connection unit, taken at the position of the first longitudinal portion, the second cross sectional cut comprises the following layers, in this order:
   a.) the first positioning wire,
   b.) the first longitudinal portion,
   c.) the substrate;

wherein the outer layer comprises at least 10 wt. %, preferably at least 25 wt. %, more preferably at least 50 wt. %, and particularly preferred at least 80 wt. %, based on the total weight of the outer layer, of an organic material.

|2| The connection unit according to embodiment |1|, wherein
- a.) the substrate comprises a second conducting region that is electrically conducting;
- b.) the conducting wire comprises a second longitudinal portion, wherein, in a third cross-sectional cut of the second longitudinal portion, the third cross-sectional cut comprises the inner metal core;
- c.) the connection unit comprises a second positioning wire,
- d.) the second longitudinal portion is located between the substrate and the second positioning wire, such that
  - A) the second longitudinal portion at least partially overlaps the second conducting region,
  - B) the second positioning wire is arranged transverse to the second longitudinal portion,
  - C) the second longitudinal portion is in electrical contact with both, and touches both
    - I. the second conducting region, and
    - II. the second positioning wire;
  and
wherein, in a fourth cross-sectional cut of the connection unit, taken at the position of the second longitudinal portion, the fourth cross sectional cut comprises the following layers, in this order:
- a.) the second positioning wire,
- b.) the second longitudinal portion,
- c.) the substrate.

|3| The connection unit according to embodiment |2|, wherein the third cross-sectional cut consists of the inner metal core.

|4| The connection unit according to any of the previous embodiments, wherein the organic material is a polymer.

|5| The connection unit according to any of the previous embodiments, wherein the organic material is a polymer selected form the group consisting of I.) a mixture comprising an electrically insulating polymer and a plurality of particles that comprises a metal or a metal compound, or a combination thereof, wherein the particles are preferably powder or fibres, wherein the particles preferably consist of one or more metals or metal compounds, preferably a metal salt, more preferably a metal halide, and particular preferred a metal chloride, or a combination thereof, preferably a combination of silver and silver chloride, II.) a conductive polymer, or III.) a combination thereof.

|6| The connection unit according to any of the previous embodiments, wherein the outer layer comprises 50 wt. %, preferably 60 wt. %, more preferably 70 wt. %, based on the total weight of the outer layer, of a metal or a metal compound, or a combination thereof.

|7| The connection unit according to any of the previous embodiments, wherein the outer layer has at least one or all of the following properties:
- a.) a thickness in the range of 6 µm to 24 µm, preferably in the range of 9 µm to 21 µm, and more preferably in the range of 12 µm to 18 µm;
- b.) an electrical conductivity in the range of $10^{-8}$ S/m to $2\times10^{-2}$ S/m, preferably in the range of $10^{-7}$ S/m to $10^{-3}$ S/m, and more preferably in the range of $5\times10^{-7}$ S/m to $2\times10^{-4}$ S/m;
- c.) a Young's modulus in the range of 0.01 MPa to 100 MPa, preferably in the range of 0.025 MPa to 40 MPa, and more preferably in the range of 0.05 MPa to 20 MPa.

|8| The connection unit according to any of the previous embodiments, wherein the first positioning wire, or the second positioning wire, or both, has, independent of each other, at least one or all of the following properties:
- a.) comprises one or more metals, preferably selected from the group consisting of gold, aluminium, silver, nickel, platinum, and cobalt, or an alloy of at least two thereof;
- b.) a thickness in the range of 5 µm to 350 µm, preferably in the range of 10 µm to 300 µm, and more preferably in the range of 20 µm to 250 µm;
- c.) a length in the range of 0.1 mm to 50 mm, preferably in the range of 0.5 mm to 10 mm, and more preferably in the range of 1 mm to 5 mm;
- d.) an electrical conductivity in the range of $10^4$ S/m to $10^8$ S/m, preferably in the range of $10^5$ S/m to $5\times10^7$ S/m, and more preferably in the range of $5\times10^5$ S/m to $2\times10^7$ S/m.

|9| The connection unit according to any of the previous embodiments, wherein the thickness of the conducting wire is in the range of 40 µm to 240 µm, preferably in the range of 60 µm to 220 µm, and more preferably in the range of 80 µm to 200 µm.

|10| The connection unit according to any of the previous embodiments, wherein the inner metal core has at least one or all of the following properties:
- a.) comprises one or more metals selected from the group consisting of gold, platinum, copper, silver, tantalum, and stainless steel, preferably platinum clad tantalum;
- b.) a thickness in the range of 40 µm to 160 µm, preferably in the range of 60 µm to 140 µm, and more preferably in the range of 80 µm to 120 µm;
- c.) an electrical conductivity in the range of $10^4$ S/m to $10^8$ S/m, preferably in the range of $10^5$ S/m to $5\times10^7$ S/m, and more preferably in the range of $5\times10^5$ S/m to $2\times10^7$ S/m;
- d.) a Young's modulus in the range of 10 GPa to 300 GPa, preferably in the range of 70 GPa to 270 GPa, and more preferably in the range of 130 GPa to 240 GPa.

|11| The connection unit according to any of the previous embodiments, wherein the intermediate layer has at least one or all of the following properties:
- a.) thickness in the range of 10 µm to 40 µm, preferably in the range of 15 µm to 35 µm, and more preferably in the range of 20 µm to 30 µm;
- b.) comprises a polymer, preferably polyurethane;
- c.) an electrical conductivity in the range of $10^{-21}$ S/m to $10^{-11}$ S/m, preferably in the range of $10^{-20}$ S/m to $10^{-12}$ S/m, and more preferably in the range of $5\times10^{-20}$ S/m to $2\times10^{-13}$ S/m;
- d.) a Young's modulus in the range of 0.05 MPa to 5500 MPa, preferably in the range of 0.1 MPa to 5000 MPa, and more preferably in the range of 0.5 MPa to 4500 MPa.

|12| The connection unit according to any of the previous embodiments, wherein the first positioning wire, or the second positioning wire, or both, is in the form of a ribbon.

|13| The connection unit according to any of the previous embodiments, wherein a cross-sectional area of the first positioning wire, or the second positioning wire, or both, has, independent of each other, any of the following shapes:

|14| The connection unit according the any of the previous embodiments, wherein the first conducting region, or the second conducting region, or both, has, independent of each other, at least one or all of the following properties:
  a.) circular;
  b.) a wedge;
  c.) a triangle;
  d.) a diamond.
|14| The connection unit according the any of the previous embodiments, wherein the first conducting region, or the second conducting region, or both, has, independent of each other, at least one or all of the following properties:
  a.) comprises a metal, preferably one or more metals selected from the group consisting of gold, copper, silver, tin, platinum, or aluminium;
  b.) has a metal plating finish, preferably gold plating;
  c.) a thickness in the range of 1.5 mm to 4.5 mm, preferably in the range of 2.0 mm to 4.0 mm, and more preferably in the range of 2.5 mm to 3.5 mm;
  d.) a length in the range of 0.2 mm to 1.2 mm, preferably in the range of 0.4 mm to 1.0 mm, and more preferably in the range of 0.6 mm to 0.8 mm;
  e.) an electrical conductivity in the range of $10^5$ S/m to $10^{10}$ S/m, preferably in the range of $10^6$ S/m to $5\times10^9$ S/m, and more preferably in the range of $5\times10^6$ S/m to $2\times10^9$ S/m.

|15| The connection unit according the any of the previous embodiments, wherein the insulating layer has at least one or all of the following properties:
  a.) comprises a glass-reinforced epoxy resin, preferably a fibreglass reinforced epoxy laminate;
  b.) a thickness in the range of $10^{-2}$ mm to 100 mm, preferably in the range of 0.1 mm to 10 mm, and more preferably in the range of 0.2 mm to 5 mm;
  c.) an electrical conductivity in the range of $10^{-16}$ S/m to $<10^{-8}$ S/m, preferably in the range of $10^{-15}$ S/m to $5\times10^{-9}$ S/m, and more preferably in the range of $2\times10^{-15}$ S/111 to $2\times10^{-9}$ S/m;

|16| A method for producing a connection unit comprising the steps of
  a.) providing a first positioning wire, a substrate, and a conducting wire, wherein
    i. the substrate comprises a first conducting region,
    ii. the conducting wire comprises a first longitudinal portion, wherein the first longitudinal portion comprises an outer layer;
  b.) arranging the first positioning wire, the substrate, and the first longitudinal portion, such that
    i. the first longitudinal portion is located between the substrate and the first positioning wire,
    ii. the first longitudinal portion at least partially overlaps the first conducting region,
    iii. the first positioning wire is transverse to the first longitudinal portion,
    iv. the first longitudinal portion is in electrical contact with both, and touches both
      A) the first conducting region, and
      B) the first positioning wire;
    v. a distance $D_1$ between the first positioning wire and the substrate is equal to an initial thickness $D_{LP1}$ of the first longitudinal portion;
  c.) reducing the distance $D_1$ between the first positioning wire and the substrate, such that
    i. $D_1 < D_{LP1}$,
    ii. the outer layer of the first longitudinal portion is deformed,
    iii. the first positioning wire exerts a mechanical force on the first longitudinal portion.

|17| The method according to embodiments |16|, wherein
  a.) the substrate comprises a second conducting region,
  b.) the conducting wire comprises a second longitudinal portion, wherein the second longitudinal portion comprises an inner metal core,
  and wherein the method comprises the following steps:
  a.) providing a second positioning wire;
  b.) arranging the second positioning wire, the substrate, and the second longitudinal portion, such that
    i. the second longitudinal portion is located between the substrate and the second positioning wire,
    ii. the second longitudinal portion at least partially overlaps the second conducting region,
    iii. the second positioning wire is transverse to the second longitudinal portion,
    iv. the second longitudinal portion is in electrical contact with both, and touches both
      A) the second conducting region, and
      B) the second positioning wire;
    v. a distance $D_2$ between the second positioning wire and the substrate is equal to an initial thickness $D_{LP2}$ of the second longitudinal portion, such that the second positioning wire exerts a mechanical force on the second longitudinal portion.

|18| The method according to any of the embodiments |16| to |17|, wherein a first force is applied to the first positioning wire, or the second positioning wire, or both.

|19| The method according to embodiment |18|, wherein the distance $D_1$, or the distance $D_2$, or both, is reduced by removing the first force.

|20| The method according to any of the embodiments |16| to |19|, wherein a second force is applied to the first positioning wire, or the second positioning wire, or both.

|21| The method according to embodiment |20|, wherein the distance $D_1$, or the distance $D_2$, or both, is reduced by applying the second force.

|22| The method according to any of the embodiments |18| to |21|, wherein at least one or all of the following applies:
  a.) the first force is applied prior to arranging the first longitudinal portion between the substrate and the first positioning wire;
  b.) the first force is applied prior to arranging the second longitudinal portion between the substrate and the second positioning wire.

|23| The method according to any of the embodiments |20| to |22|, wherein at least one or all of the following applies:
  a.) the second force is applied after arranging the first longitudinal portion between the substrate and the first positioning wire;
  b.) the second force is applied after arranging the second longitudinal portion between the substrate and the second positioning wire.

|24| The method according to any of the embodiments |16| to |23|, wherein the first positioning wire, or the second positioning wire, or both, is, independent of each other, secured to the substrate at, at least two connection point using any of the following:
  a.) laser welding;
  b.) resistance welding;
  c.) wire bonding;
  d.) ribbon bonding.

|25| The method according to any of the embodiments |18| to |24|, wherein the strength of the first force, or the second force, or both, is, independent of each other, in the range of 0.5 N to 15 N, preferably in the range of 1 N to 12 N, and more preferably in the range of 2 N to 8 N.

|26| The method according to any of the embodiments |17| to |25|, wherein the second positioning wire is resistance welded to the second longitudinal portion.

|27| A connection unit obtainable by a method according to any of the embodiments |16| to |26|.
|28| An electronic device comprising a further electronic element that is in electrical contact with a connection unit according to any of the embodiments |1| to |15| and embodiment |27|.
|29| The electronic device according to embodiments |28|, wherein the electronic device is selected from the group consisting of continuous glucose monitors, electrocardiographs, electromyographs, and electroencephalogram devices.
|30| A use of the connection unit in the electronic device according to any of the embodiments |28| and |29|.
|31| A use of the connection unit according to any of the embodiments |1| to |15| and embodiment |27|, and the electronic device according to the embodiments |28| and |29| to achieve at least one or all of the following:
a.) improve electrical conductivity;
b.) provide more reliable measurements;
c.) improve durability;
d.) improved layer integrity;
e.) reduce takt time;
f.) reduce energy consumption during production;
g.) reduce the amount of materials needed during production;
or a combination of two or more of the above.

DETAILED DESCRIPTION OF THE INVENTION

Figure 1A:
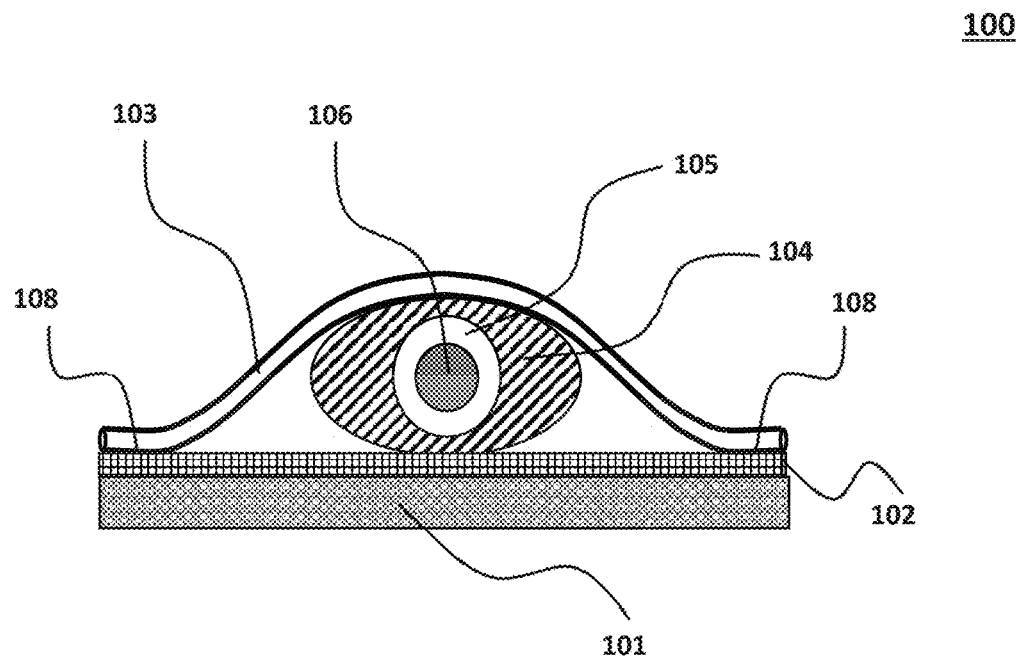
FIG. 1A is a cross-sectional cut of a connection unit.

The terms "insulating" or "conducting", or related terms, should be understood to refer to the electrical properties of a component, and not, e.g., the heat transfer property of a component. In the context of the present invention, a component is defined as being "electrically insulating" when it has an electrical conductivity that is less than $10^{-8}$ S/m, while a component is defined as being "electrically conducting" when it has an electrical conductivity that is larger than, or equal to $10^{-8}$ S/m. Furthermore, when any number of components are in "electrical contact", this should be understood to mean that an electric current can flow between the any number of components.

Consider two components that are both elongated, e.g., two electrically conducting wires. For the first component, a first axis can be defined that is parallel to the length of the first component. Similarly, for the second component, a second axis can be defined that is parallel to the length of the second component. When it is stated that the first component is "transverse" to the second component, this should not be limited to a scenario where the first axis is perpendicular to the second axis. The only scenario that is excluded is the scenario where the first axis is to parallel to the second axis.

In the context of the present, a "mechanical force" is defined as the force that a first component exerts on a second component when the first component and the second component touch each other. A "mechanical force" does not refer to a force that a first component can exert on a second component, without the first component and the second component touching each other, e.g., electromagnetic forces.

A first aspect of the invention is a connection unit that comprises a substrate, at least one positioning wire, and a conducting wire. It is also preferred that the substrate comprises at least one conducting region. In this aspect, it is more preferred that the substrate comprises at least two conducting regions. It is also more preferred that the connection unit comprises at least two positioning wires.

The Substrate

In a further aspect of the invention, it is preferred that the substrate comprises an insulating layer that is electrically insulating. It is further preferred that the substrate comprises at least one conducting region that is electrically conducting. It is preferred that the at least one conducting region and the insulating layer touch each other. It is also preferred that the at least one conducting region is either adjacent to the insulating layer, without being embedded in the insulating layer, or that the at least one conducting region is partially embedded in the insulating layer.

No specific geometric shape is preferred for the at least one conducting region. E.g., the at least one conducting region can be in the shape of a wire. E.g., the at least one conducting region can be in the shape of a ribbon. E.g., the at least one conducting region can be in the form of a thin layer that at least partially covers the surface of the insulating layer.

It is preferred that the at least one conducting region comprises at least one metal, preferably one or more metals selected from the group consisting of gold, copper, silver, tin, platinum, or aluminium, or combinations like alloys thereof. It is preferred that the insulating layer is a glass-reinforced epoxy laminate material. It is further preferred that the insulating layer is a composite material comprising fiberglass and an epoxy resin.

In the present invention, examples of the at least one conducting region are a first conducting region and a second conducting region. It is preferred that the first conducting region and the second conducting region have, independent of each other, at least one of the preferred aspects of the at least one conducting region.

The Positioning Wire

In an aspect of the invention, the connection unit comprises at least one positioning wire. In another aspect of the invention, it is preferred to apply at least one force to the at least one positioning wire. In this aspect it is further preferred that the at least one positioning wire will not break when the at least one force is applied. In this aspect, it is also preferred that the application of the at least one force will deform the shape of the at least one positioning wire. If the at least one force leads to a deformation, then it is further preferred that when the at least one force is removed, either a) the at least one positioning wire will retain its deformed shape, or b) the at least one positioning wire will at least partially regain its initial shape, prior to the application of the at least one force.

It is preferred that a cross-sectional area of the at least one positioning wire should have one of the following shapes: circular, a wedge, a triangle, or a diamond. It is preferred that the cross-sectional area refers to the area of a cut made perpendicular to the length of the at least one positioning wire. It is also preferred that the at least one positioning wire should be electrically conducting.

In the present invention, examples of the at least one positioning wire are a first positioning wire and a second positioning wire. It is preferred that the first positioning wire and the second positioning wire have, independent of each other, at least one of the preferred aspects of the at least one positioning wire.

The Conducting Wire

In a further aspect of the invention, it is preferred that the conducting wire comprises at least one longitudinal portion. In the context of the present invention, a "longitudinal portion" of the conducting wire refers to a portion of the conducting wire defined along the length of the conducting wire.

It is more preferred that when at least one cross-sectional cut is made of the at least one longitudinal portion, the at least one cross-sectional cut of the at least one longitudinal portion comprises an electrically conducting inner metal core. It is particularly preferred that the at least one cross-sectional of the at least one longitudinal portion cut comprises the following layers, in this order: an outer layer that is electrically conducting, an intermediate layer that is electrically insulating, the inner metal core, the intermediate layer, and the outer layer.

It is preferred that the at least one cross-sectional of the at least one longitudinal portion cut is made perpendicular to the length of the at least one longitudinal portion. It is preferred that the intermediate layer surrounds the inner metal core. It is further preferred that the outer layer surrounds the intermediate layer.

It is preferred that the outer layer comprises a polymer. It is further preferred that the outer layer comprises an electrically insulating polymer and a.) an electrically conducting powder or b.) electrically conducting fibres, or c.) both a.) and c.).

E.g., it is preferred that the outer layer comprises an electrically insulating polymer, preferably a polycondensation polymer, more preferably a polyamine, a polyester, a polyamine or a polyurethane or a combination of at least two thereof, wherein a polyurethane is preferred. It is preferred that the weight of the electrically insulating polymer is less than 40 wt. %, preferably less than 35 wt. %, and more preferably less than 30 wt. %, based on the total weight of the outer layer. If the outer layer comprises an electrically insulating polymer and electrically conducting powder, fibres, or both, it is furthermore preferred that the weight of the electrically conducting powder, fibres, or both, is more than 50 wt. %, preferably more than 60 wt. %, and further preferably more than 70 wt. %, based on the total weight of the outer layer.

In another aspect of the invention it is also preferred that the outer layer comprises an electrically conducting polymer. It is preferred that the weight of the electrically conducting polymer is at least 60 wt. %, preferably at least 70 wt. %, and more preferably at least 80 wt. %, based on the total weight of the outer layer.

Conductive polymers according to the present invention preferably have a conductivity of at least $10^{-2}$ S/m, more preferably at least $10^{-1}$ S/m, and further preferably at least 1 S/m. Preferably conductive polymers are one or more selected from the group consisting of polythiophenes, poly(fluorene)s, polyphenylenes, polypyrenes, polyazulenes, and polynaphthalenes, or combinations thereof, wherein conductive polymers comprising polythiophenes or polypyrenes are particular and those comprising polythiophenes are even more preferred.

According to a preferred embodiment of the present invention the conductive polymer comprises a cationic conductive polymer, preferably a cationic polythiophene, as the conductive polymer and a polymeric anion as a counter-ion for the cationic conductive polymer, preferably a polymeric sulfonic acid or a polymeric carboxylic acid, wherein it is particularly preferred that the cationic polythiophene and the polymeric anion are present in the form of a polythiophene:polymeric anion-complex, preferably a poly(3,4-ethylenedioxythiophene):polystyrene sulfonic acid complex (also referred to as "PEDOT:PSS-complex"). Such a complex can be obtained if the monomers on which the polythiophene is based (such as 3,4-ethylenedioxythiophene) are polymerized in the presence of the polymeric anion in an aqueous solution as disclosed by Kirchmeyer et al. in the Journal of Materials Chemistry (2005), 15(21), pages 2077-2088. In this context it may be particularly preferred that the conductive polymer comprises the cationic conductive polymer, preferably poly(3,4-ethylenedioxythiophene), and the polymeric anion, preferably a polymeric sulfonic acid such as PSS, in a weight ratio cationic conductive polymer:polymeric anion of greater than 0.4, preferably greater than 0.5, more preferably greater than 0.6 and even more preferably greater than 0.65. If, for example, the outer layer comprises 1 part by weight of the cationic conductive polymer and 2 parts by weight of the polymeric sulfonic acid, the weight ratio cationic conductive polymer:polymeric acid would be 0.5 (i. e. 1:2). PEDOT:PSS-complex based conductive polymers are commercially available from Heraeus Deutschland GmbH, Germany under the tradename Clevios®.

In the present invention, examples of the at least one longitudinal portion are a first longitudinal portion and a second longitudinal portion. It is preferred that the first longitudinal portion and the second longitudinal portion have, independent of each other, at least one of the preferred aspects of the at least one longitudinal portion. In the present invention, examples of the at least one cross-sectional cut of the at least one longitudinal portion are a first cross-sectional cut and a third cross-sectional cut.

The Connection Unit

In another aspect of the invention, it is preferred that the at least one positioning wire should be secured to the substrate at, at least two connection points. It is more preferred that the positioning wire should be secured to the at least one conducting region. It is further preferred that the at least one positioning wire should be in electrical contact with the substrate. It is particularly preferred that the at least one positioning wire should be in electrical contact with the at least one conducting region.

In an aspect of the invention, at least one cross-sectional cut is made of the connection unit. It is preferred that the at least one cross-sectional cut of the connection unit is made perpendicular to the conducting wire. It is more preferred that the at least one cross-sectional cut of the connection unit is made at the position of the at least one longitudinal portion. In the present invention, examples of the at least one cross-sectional cut of the connection unit are a second cross-sectional cut and a fourth cross-sectional cut.

The Connection Unit with Multiple

In one aspect of the invention, it is preferred that the connection unit comprises multiple longitudinal portions. In this aspect it is also preferred that the multiple longitudinal portions are in electrical contact with each other. In this aspect it is further preferred that the multiple longitudinal portions are part of the same conducting wire.

In the same aspect, it is more preferred that the connection unit comprises multiple conducting regions, wherein the number of multiple conducting regions is equal to, or larger than the number of multiple longitudinal portions. In this aspect, it is further preferred that the connection unit comprises at least one positioning wire. In this aspect, it is even further preferred that the connection unit comprises multiple positioning wires, wherein the number of multiple positioning wires is equal to the number of longitudinal portions.

In the same aspect, it is preferred that at least two of the multiple positioning wires are in electrical contact with, and touching the same conducting region. In this aspect, it is further preferred that each of the multiple positioning wires are in electrical contact with, and touching a different conducting region of the multiple conducting regions.

Also preferred is a connection assembly that comprises multiple connection units. It is preferred that the multiple connection units are in electrical contact with each other.

Producing the Connection Unit

One aspect of the invention relates to a method for producing a connection unit, wherein the connection unit comprises at least one positioning wire, a substrate, and a conducting wire. It is more preferred that the conducting wire comprises at least one longitudinal portion. It is also preferred that the substrate comprises at least one conducting region. It is particularly preferred that the connection unit that is produced has at least one of the preferred aspects disclosed in the previous sections.

It is preferred that the method for producing the connection unit comprises the following steps:

| | |
|---|---|
| E1 | arranging the at least one longitudinal portion to be in electrical contact with the substrate, preferably the at least one conducting region; |
| X1 | arranging the at least one longitudinal portion to touch the substrate, preferably the at least one conducting region; |
| E2 | arranging the at least one positioning wire to be in electrical contact with the substrate, preferably the at least one conducting region; |
| X2 | arranging the at least one positioning wire to touch the substrate, preferably the at least one conducting region; |
| F1 | applying a first force to the at least one positioning wire; |
| F2 | applying a second force to the at least one positioning wire; |
| E3 | arranging the at least one longitudinal portion to be in electrical contact with theat least one positioning wire; |
| X3 | arranging the at least one longitudinal portion to touch the at least one positioning wire; |
| R1 | removing the first force; |
| R2 | removing the second force; |
| W1 | securing the at least one positioning wire to the substrate, preferably to the at least one conducting region, at a first connection point; |
| W2 | securing the at least one positioning wire to the substrate, preferably to the at least one conducting region, at a second connection point; |

-continued

| | |
|---|---|
| W3 | securing the at least one positioning wire to the at least one longitudinal portion. |

Preferable examples of the method for producing the connection unit are listed below. It should be noted that the steps are preferably performed in the order that they are listed. It should also be noted that it is preferred for all steps listed in the same set of round brackets to be performed simultaneously. E.g., (X1, X4) indicates that steps X1 and X4 are preferably performed simultaneously.

Preferable examples of the method for producing the connection unit include the following:

[A] (E2, X2), F1, (E1, X1), R1, (E3, X3), (W1, W2);
[B] (E2, X2), (E1, X1), F2, (E3, X3), R2, (W1, W2);
[C] (E2, X2), (E1, X1), F2, (E3, X3), (W1, W2), R2;
[D] (E1, X1), (E2, X2), F2, (E3, X3), R2, (W1, W2);
[E] (E1, X1), (E2, X2), F2, (E3, X3), (W1, W2), R2;
[F] (E2, X2), W1, (E1, X1, E3, X3), F2, R2, W2;
[G] (E2, X2), W1, (E1, X1, E3, X3), F2, W2, R2;
[H] (E1, X1), (E2, X2, E3, X3), W1, F2, R2, W2
[I] (E1, X1), (E2, X2, E3, X3), W1, F2, W2, R2
[J] (E2, X2), W1, F1, (E1, X1), R1, (E3, X3), F2, W2, R2;
[K] (E2, X2), W1, F1, (E1, X1), R1, (E3, X3), F2, R2, W2;
[L] (E2, X2), W1, F1, (E1, X1, E3, X3), R2, F2, W2, R2;
[M] (E2, X2), W1, F1, (E1, X1, E3, X3), R2, F2, R2, W2;
[N] (E2, X2), (W1, W2), (E1, X1), F2, (E3, X3), R2;
[O] (E1, X1), (E2, X2), (W1, W2), F2, (E3, X3), R2
[P] (E2, X2), W1, (E1, X1), F2, (E3, X3), W2, R2;
[Q] (E2, X2), W1, (E1, X1), F2, (E3, X3), R2, W2;
[R] (E1, X1), (E2, X2), W1, F2, (E3, X3), W2, R2;
[S] (E1, X1), (E2, X2), W1, F2, (E3, X3), R2, W2;
[T] (E1, X1), (E2, X2, E3, X3, W1, W2);
[U] Any of the examples [A] though [T], followed by W3.

Prior to arranging the at least one positioning wire so that it touches the substrate, it is also preferred to first machine at least one partial surface of the substrate. It is further preferred to metal plate the at least one partial surface in order to create an electrical contact between the at least one partial surface and the at least one conducting region.

E.g., at least one hole is machined through the substrate, and the at least one positioning wire is threaded through the at least one hole. It is preferred that when the at least one positioning wire is threaded through the at least one hole, that the at least one positioning wire touches the surface of the substrate that confines the at least one hole. It is also preferred that the at least one positioning wire can move slidably through the at least one hole. E.g., at least one section of the surface of the substrate is machined in order to change the slope of the at least one section. It is preferred that the at least one positioning wire is allowed to touch the substrate at the at least one section.

Preferred methods for securing the at least one positioning wire to the substrate at, at least one connection point include laser welding, resistance welding, wire bonding, and ribbon bonding. These bonding methods are described in the following books: *Handbook of Laser Welding Technologies* (2013), Katayama; *Welding Engineering: An Introduction* (2016), Phillips; *Wire Bonding in Microelectronics* (2010), Harman; *Wide Bandgap Power Semiconductor Packaging: Materials, Components, and Reliability* (2018), Suganama. An example of wire bonding is wedge-to-wedge bonding, described in *Modern Wedge Bond* (E-Book-012013-04), Palomar Technologies.

Application of a Force

In one aspect of the invention, it is preferred to apply at least one force on the at least one positioning wire. It is more preferred that the at least one force is a mechanical force. It is further preferred that the strength of the at least one force is of less than 100 N, preferably less than 50 N, and more preferably less than 25 N. It is also preferred to apply the at least one force for less than 10 seconds, preferably less than 1 second, and more preferably less than 0.5 seconds. When the at least one force is applied to the at least one positioning wire, it is preferred that the at least one positioning wire is deformed, without breaking.

It is preferred that a distance D between the substrate and the at least one positioning wire should be measured along an imaginary line that has at least one, and more preferably all, of the following properties:

(i) is perpendicular to the surface of the substrate;
(ii) passes through a centre of a position between the substrate and the at least one positioning wire, preferably the position where the at least one longitudinal position will be located when production of the connection unit is completed;
(iii) is perpendicular to a final orientation of the at least one longitudinal portion when production of the connection unit is completed.
(iv) passes through a contact point on the at least one positioning wire, wherein the contact point will touch the at least one longitudinal portion when production of the connection unit is completed.

In the present invention, examples of the at least one force are the first force and the force. It is preferred that the first force and the second force have, independent of each other, at least one of the preferred aspects of the at least one force.

It is preferred that the application of the first force leads to an increase in the distance D. It is also preferred that removing the first force leads to a decrease in the distance D. It is further preferred that the application of the second force leads to a decrease in the distance D. It is even further preferred that removing the second force does not lead to a change in the distance D.

In one aspect of the invention, the at least one longitudinal portion is arranged between the at least one positioning wire and the substrate. It is preferred to apply the first force, prior to arranging the at least one longitudinal portion between the at least one positioning wire and the substrate, when the distance D is less than the thickness of the at least one longitudinal portion. It is also preferred to apply the second force, after the at least one longitudinal portion has been arranged between the at least one positioning wire and the substrate, when the distance D is larger than the thickness of the at least one longitudinal portion.

In another aspect of the invention, it is preferred that reducing the distance D leads to a value for D that is smaller than an initial thickness $D_{LP}$ of the at least one longitudinal portion. The "initial thickness" is defined as the thickness of the at least one longitudinal portion prior to the at least one longitudinal portion being arranged in touch with the at least one positioning wire. In this specific aspect, it is preferred that the decrease $D<D_{LP}$ leads to a deformation of the outer layer of the conducting wire. It is further preferred that $D<D_{LP}$ leads to the at least one positioning wire being at least partially embedded in the outer layer.

Producing a Connection Unit with Multiple

In one aspect of the invention, it is preferred that the connection unit that is produced has a conducting wire that comprises multiple longitudinal portions. In this aspect it is preferred that the substrate has multiple conducting regions.

In this aspect it is also preferred that the connection unit comprises multiple positioning wires.

In this aspect it is further preferred that the number of multiple longitudinal portions is less than, or equal to the number of multiple conducting regions. In this aspect, it is also preferred that the number of the multiple positioning wire is less than, or equal to the number of multiple conducting regions.

A "connector set" is defined as a set comprising one of the conducting regions from the multiple conducting regions, one of the longitudinal portions from the multiple longitudinal portions, and one of the positioning wires from the multitude of positioning wire. It is preferred that a longitudinal portion of the multitude of longitudinal portions is not part of more than one connector set. It is also preferred that a conducting region of the multitude of conducting regions is not part of more than one connector set.

It is preferred that the connection unit produced has at least one connector set. It is further preferred that for every connector set, at least one of the method steps E1, E2, E3, X1, X2, X3, F1, F2, R1, R2, W1, W2, W3, will be performed. It is particularly preferred that for every connector set, one of the example steps [A] to [U] will be performed.

If the connection unit comprises multiple connector sets, it is not a requirement that the same method steps should be performed for every connector set of the multiple connector sets. It is also not a requirement that any of the method steps performed on the multiple connector sets should occur simultaneously.

E.g., it is preferred to produce a connection unit, wherein the connection unit comprises a first connector set and a second connector set. The first connector set comprises a first conducting region, a first longitudinal portion, and a first positioning wire. The first longitudinal portion comprises an outer layer. The second connector set comprises a second conducting region, a second longitudinal portion, and a second positioning wire. The second longitudinal portion has only an inner metal core. Using the subscript "i" to denote method steps performed on the first connector set, and the subscript "ii" to denote method steps performed on the second connector set, possible examples of methods that can be used to produce the connection unit include:

A.] $(E2_i, X2_i)$, $(W1_i, W2_i)$, $(E1_i, X1_i)$, $F2_i$, $(E3_i, X3_i)$, $R2_i$, $(E2_{ii}, X2_{ii})$, $(W1_{ii}, W2_{ii})$, $(E1_{ii}, X1_{ii})$, $F2_{ii}$, $(E3_{ii}, X3_{ii})$, $R2_{ii}$, $W3_{ii}$;

B.] $(E2_{ii}, X2_{ii})$, $(W1_{ii}, W2_{ii})$, $(E1_{ii}, X1_{ii})$, $F2_{ii}$, $(E3_{ii}, X3_{ii})$, $R2_{ii}$, $W3_{ii}$, $(E2_i, X2_i)$, $(W1_i, W2_i)$, $(E1_i, X1_i)$, $F2_i$, $(E3_i, X3_i)$, $R2_i$;

C.] $(E2_i, X2_i, E2_{ii}, X2_{ii})$, $(W1_i, W2_i, W1_{ii}, W2_{ii})$, $(E1_i, X1_i, E1_{ii}, X1_{ii})$, $(F2_i, F2_{ii})$, $(E3_i, X3_i, E3_{ii}, X3_{ii})$, $(R2_i, R2_{ii})$, $W3_{ii}$;

In another aspect of the invention, it is preferred to overpot the whole connection unit with an electrically insulating epoxy when production of the connection unit, as described above, has been completed.

Use of the Connection Unit

In one aspect of the invention, it is preferred to use the connection unit in electronic devices, more preferably medical devices. It is also preferred that one end of the conducting wire is used as an electrode. It is preferred that the electrode comprises the outer conducting layer and the inner metal core. It is according to another aspect preferred that the electrode is inserted directly into a patient. According to yet another aspect it is preferred that the electrode is used for making measurements. It is also preferred to use the connection unit in a measuring unit. It is further preferred that the measuring unit is either placed on the skin of the patient, or inserted into the patient.

The invention is now illustrated by non-limiting examples and exemplifying embodiments.

FIGURES

List of Figures

Figure 1B:
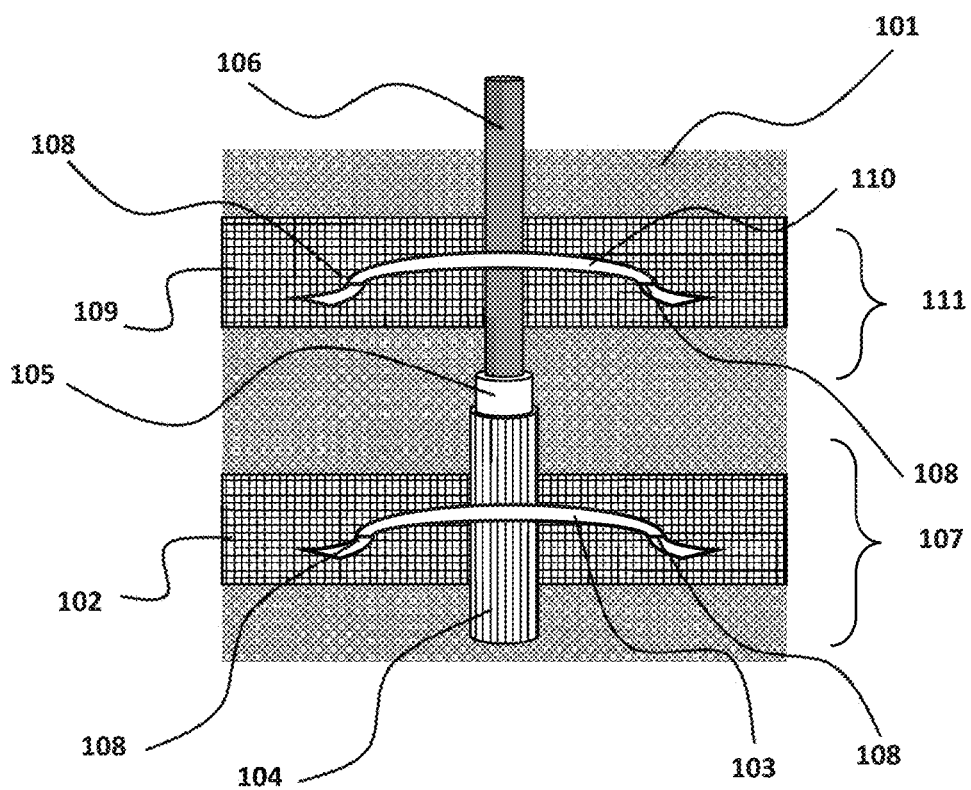
FIG. 1B is a plan view from above of a connection unit.
Figure 2:
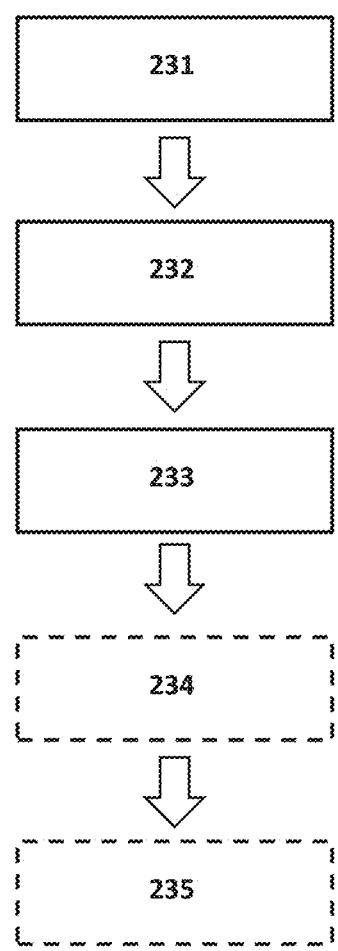
FIG. 2 shows method steps for producing a connection unit.

FIG. 1A: cross-sectional cut of a connection unit.
FIG. 1B: plan view from above of a connection unit.
FIG. 2: method steps for producing a connection unit.
FIG. 3: first example method for producing a connection unit. Shown is a is a cross-sectional cut of the connection unit.
FIG. 4: second example method for producing a connection unit. Shown is a cross-sectional cut of the connection unit.
FIG. 5: third example method for producing a connection unit. Shown is a cross-sectional cut of the connection unit.
FIG. 6: fourth example method for producing a connection unit. Shown is a cross-sectional cut of the connection unit.
FIG. 7: fifth example method for producing a connection unit. Shown is a cross-sectional cut of the connection unit.
FIG. 8A: side view of a connection unit.
FIG. 8B-8E: sixth example method for producing a connection unit. Shown is a cross-sectional cut of the connection unit.
FIG. 9: seventh example method for producing a connection unit. Shown is a cross-sectional cut of the connection unit.
FIG. 10: use of a connection unit in a continuous glucose monitor.

Note that the figures are not drawn to scale.

DESCRIPTION OF FIGURES

FIG. 1A shows a cross-sectional cut of a connection unit 100 that has a substrate, a conducting wire with a first longitudinal portion, and a first positioning wire 103. The cross-sectional cut has been made perpendicular to the conducting wire and at the position of the first longitudinal portion. From FIG. 1A an insulating layer 101 and a conducting region 102 of the substrate can be seen. FIG. 1A also shows the positioning wire 103 that has been secured to the substrate at two points 108. Between the positioning wire 103 and the first conducting region 102 is the conducting wire with an outer layer 104 that is deformed, an intermediate layer 105, and an inner metal core 106. FIG. 1A further shows that the outer layer 104 is in electrical contact, as well as touching the first conducting region 102. FIG. 1A also shows that the outer layer 104 is in electrical contact, as well as touching the first positioning wire 103.

FIG. 1B is a plan view of a connection unit from above. FIG. 1B shows an insulating layer 101 of the substrate, as well as a first conducting region 102. FIG. 1B further shows a first longitudinal portion 107 that consists of an outer layer 104, an intermediate layer (not shown), and an inner metal core (not shown). The first longitudinal portion 107 is in electrical contact with, as well as touching, the first conducting region 102. FIG. 1B also shows a first positioning wire 103 that touches the first longitudinal portion 107, as well as being in contact with the first longitudinal portion 107.

FIG. 1B further shows a second conducting region 109, as well as a second longitudinal portion 111. The second longitudinal portion 111 consists of only the metal core 106. The second longitudinal portion is in electrical contact with both, as well as touching both, the second conducting region 109 and a second positioning wire 110. FIG. 1B also shows that the first positioning wire 103 and the second positioning wire 110 are secured to the first conducting region 102 and the second conducting region 109, respectively, at the connection points 108.

FIG. 2 shows the method steps of producing a connection unit. In the first step 231, a substrate that comprises a first conducting region and an insulating layer is provided. Furthermore, a first positioning wire, as well as a conducting wire is also provided. The conducting wire comprises a first longitudinal portion, wherein the first longitudinal portion has an inner metal core that is surrounded by an intermediate layer, with the intermediate layer in turn surrounded by an outer layer. The inner metal core and the outer layer are both electrically conducting, while the intermediate layer is electrically insulating.

In step 232, the first longitudinal portion is arranged between the first positioning wire and the first conducting region so that the first longitudinal portion is in electrical contact with both the first positioning wire and the first conducting region. Furthermore, the first positioning wire is arranged transverse to the first longitudinal portion. The first longitudinal portion is also arranged so that it touches both the first positioning wire and the first conducting region, without the outer layer of the longitudinal portion being deformed.

In step 233 a distance between the first positioning wire and the first conducting region is decreased, so that the outer layer of the first longitudinal portion is deformed, and so that the first positioning wire exerts a mechanical force on the first longitudinal portion.

In the optional step 234, the substrate comprises a second conducting region, while the conducting wire comprises a second longitudinal portion. The second longitudinal portion consists of only the inner metal core. Furthermore, a second positioning wire is provided. In step 235, the second longitudinal portion is arranged between the second positioning wire and the second conducting region. Furthermore, the second longitudinal portion is arranged to transverse to the second positioning wire. In step 235, the second longitudinal portion is also arranged in electrical contact with both the second conducting region and the second positioning wire. The second longitudinal portion also touches the second conducting region and the second positioning wire, with the latter exerting a mechanical force on the second longitudinal portion. FIGS. 3 through 9 shows possible examples of the method steps for producing a connection unit. Unless indicated otherwise, the steps should be performed in the order that they are given. Shown are cross-sectional cuts of the connection unit, wherein the cut is made perpendicular to a conducting wire, and parallel to a first positioning wire. Furthermore, the cut is made at the position where a first longitudinal portion of the conducting wire is to be placed.

For FIGS. 3 through 9, the first longitudinal portion and the first positioning wire are arranged so that the first positioning wire is transverse to the first longitudinal portion. Furthermore, the thickness of the first longitudinal portion, prior to touching the first positioning wire, is $D_{LP1}$. In each of the examples in FIGS. 3 through 8, the first positioning wire is secured to a first conducting region of a substrate using laser welding.

Figure 3A:
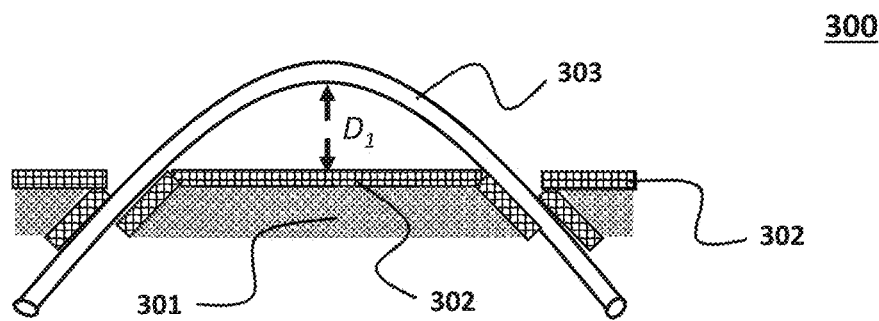
FIGS. 3A-3C show a first example method for producing a connection unit. Shown is a is a cross-sectional cut of the connection unit.

FIG. 3A shows
a.) that a substrate with an insulating layer 301 is provided. Two holes are machined at an angle through the substrate. It is not a requirement that the holes have to be machined at an angle, but it is preferred;
b.) the substrate, including the machined holes, are metal plated to form a first conducting region 302;
c.) a first positioning wire 303 is threaded through the holes in the substrate. A distance $D_1$ between the first positioning wire 303 and the first conducting region 302 is less than a distance $D_{LP1}$.

Figure 3B:
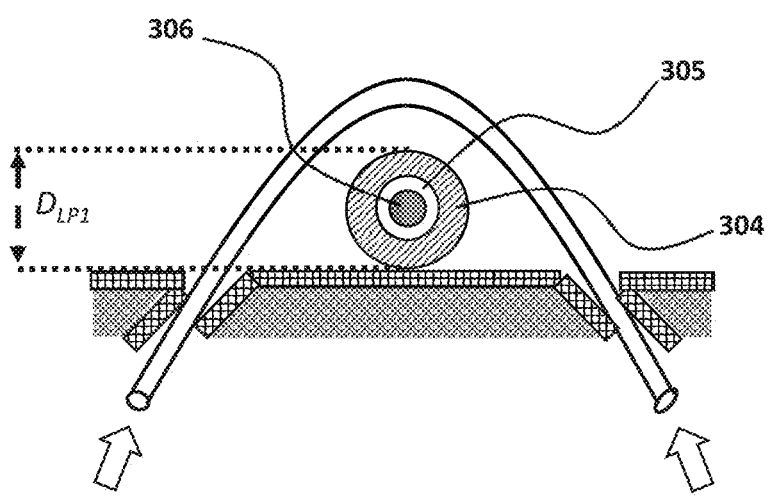

FIG. 3B shows
d.) that a first force, indicated by the arrows, is applied to the ends of the first positioning wire 303, thereby deforming the positioning wire 303. The deformation leads to an increase in $D_1$ so that $D_1 > D_{LP1}$;
e.) a first longitudinal portion of a conducting wire is placed between the first conducting region 302 and first positioning wire 303, so that an outer layer 304 of the first longitudinal portion is in electrical contact with, as well as touching the first conducting region 302. The first longitudinal portion also has an inner metal core 306, surrounded by an intermediate layer 305.

Figure 3C:
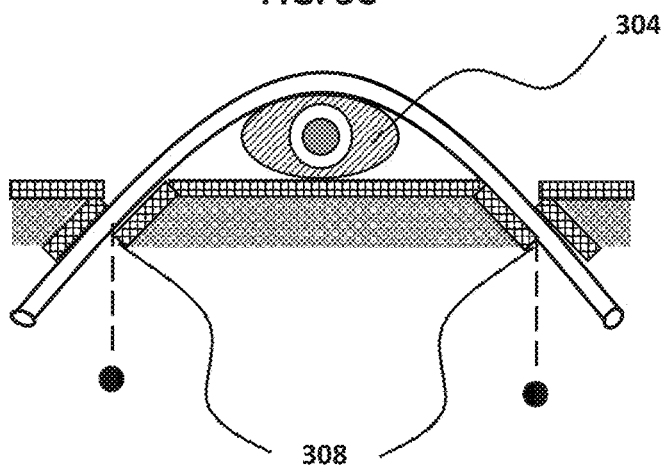

FIG. 3C shows
f.) that the first force is removed, which leads to the first positioning wire 303 trying to recover the shape it had prior to the application of the first force. This leads to $D_1$ decreasing. As a result, the first positioning wire 303 is brought in electrical contact with, as well as touching the outer layer 304. The aforementioned decrease is such that $D_1 < D_{LP1}$, and consequently the outer layer 304 is deformed;
g.) the first positioning wire 303 is secured to the first conducting region 302 at connection points 308.

Figure 4A:
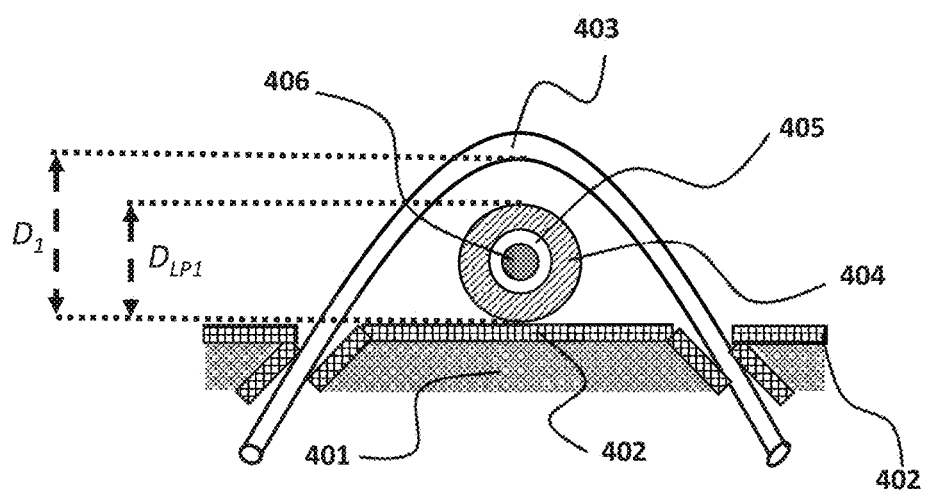
FIGS. 4A-4B show a second example method for producing a connection unit. Shown is a cross-sectional cut of the connection unit.

FIG. 4A shows
a.) that a substrate with an insulating layer 401 is provided. Two holes are machined at an angle through the substrate. It is not a requirement that the holes have to be machined at an angle, but it is preferred;
b.) the substrate, including the machined holes, are metal plated to form a first conducting region 402;
c.) a first positioning wire 403 is threaded through the holes in the substrate. A distance $D_1$ between the first positioning wire 403 and the first conducting region 402 is larger than a distance $D_{LP1}$;
d.) a conducting wire with a first longitudinal portion is arranged between the first conducting region 402 and the first positioning wire 403. Furthermore, an outer layer 404 of the first longitudinal portion is in electrical contact with, as well as touching the first conducting region 402. The first longitudinal portion also has an inner metal core 406 surrounded by an intermediate layer 405. Note that the thickness of the first longitudinal portion is $D_{LP1}$.

It is also possible to first arrange the outer layer 404 to be in electrical contact with, as well as touching the first conducting region 402, before the first positioning wire 403 is threaded through the holes in the substrate (step c.) above).

Figure 4B:
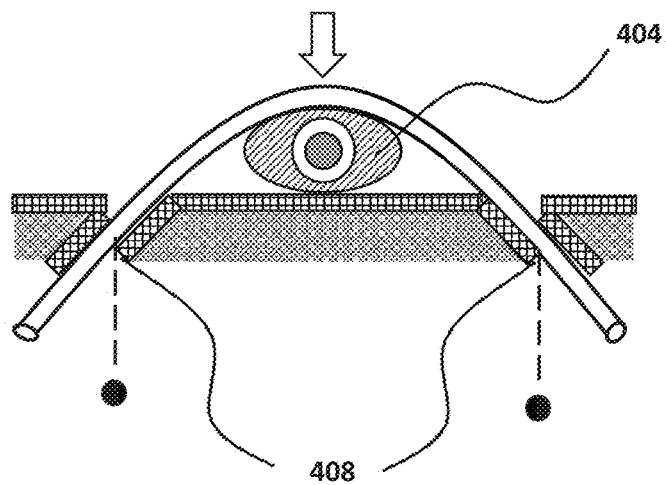

FIG. 4B shows
e.) that a second force, indicated by the arrow, is applied to the first positioning wire 403, thereby deforming the positioning wire 403. The deformation leads to a decrease in $D_1$ so that $D_1 < D_{LP1}$. As a result, the first positioning wire 403 is brought in electrical contact with, as well as touching the outer layer 404. The deformation of the first positioning wire 403 also leads to a deformation of the outer layer 404;
f.) the first positioning 403 wire is secured to the first conducting region 402 at connection points 408;
g.) the second force is removed.

Figure 5A:
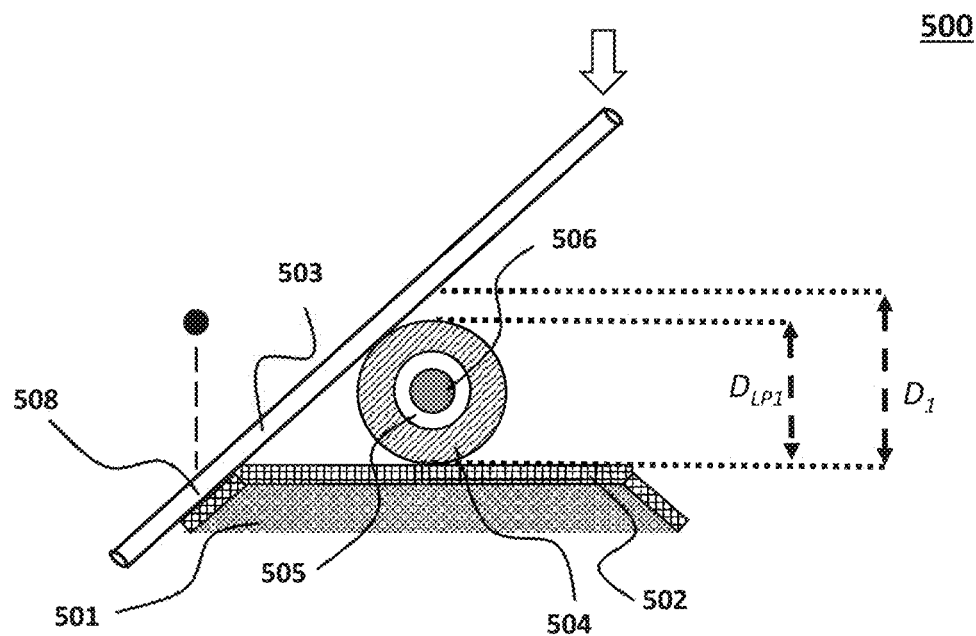
FIGS. 5A-5B show a third example method for producing a connection unit. Shown is a cross-sectional cut of the connection unit.

FIG. 5A shows
a.) that a substrate with an insulating layer 501 is provided. Two opposite edges of the substrate are machined to form a slope. It is not a requirement that the two opposite edges have to be machined, but it is preferred;
b.) the substrate is metal plated to form a first conducting region 502;
c.) a first end of a first positioning wire 503 is secured to the first conducting region 502 at a first connection point 508, wherein the first connection point 508 is located on the first machined edge;
d.) a first longitudinal portion of a conducting wire is placed between the first conducting region 502 and the first positioning wire 503. The first longitudinal portion has an outer layer 504 that is brought into electrical contact with, as well as toughing the first conducting region 502. The longitudinal portion also has an intermediate layer 505 and an inner metal core 506. Although this is not a requirement, the outer layer 504 is also is brought into electrical contact with, as well as toughing the first positioning wire 503. FIG. 5a also shows that a distance $D_1$ between the first positioning wire 503 and the first conducting region 502 is larger than a distance $D_{LP1}$;
e.) a second force, indicated by the arrow, is applied to a second end of the first positioning wire 503.

Note that it is also possible to first place the outer layer 504 in electrical contact with, as well as touching the first conducting region 502, prior to the first positioning 503 wire being secured at connection point 508 (step c.) above).

Figure 5B:
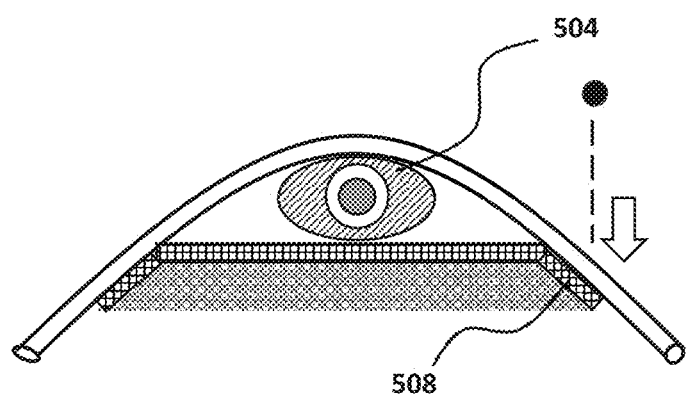

FIG. 5B shows
f.) that the second force deforms the first positioning wire, leading to a decrease in $D_1$ such that $D_1 < D_{LP1}$. As a result, the outer layer 504 is deformed. The first positioning wire 503 is in electrical contact with, as well as touching the outer layer 504;
g.) the first positioning wire 503 is secured to the first conducting region at a second connection point 508, wherein the second connection points is located on the second machined edge;
h.) the second force is removed.

Figure 6A:
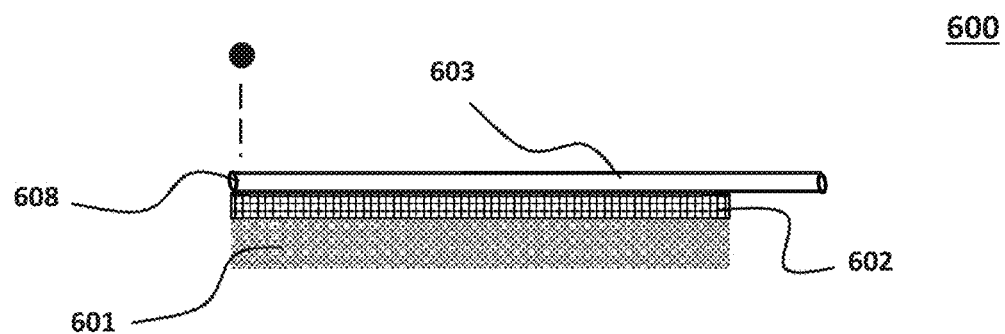
FIGS. 6A-6D show a fourth example method for producing a connection unit. Shown is a cross-sectional cut of the connection unit.

FIG. 6A shows
a.) that a substrate with an insulating layer 601 that has been metal plated to form a first conducting region 602 is provided;
b.) a first positioning wire 603 is arranged parallel to the surface of the first conducting region 602;
c.) a first end of the positioning wire 603 is secured to the first conducting region 602 at a first connection point 608.

Figure 6B:
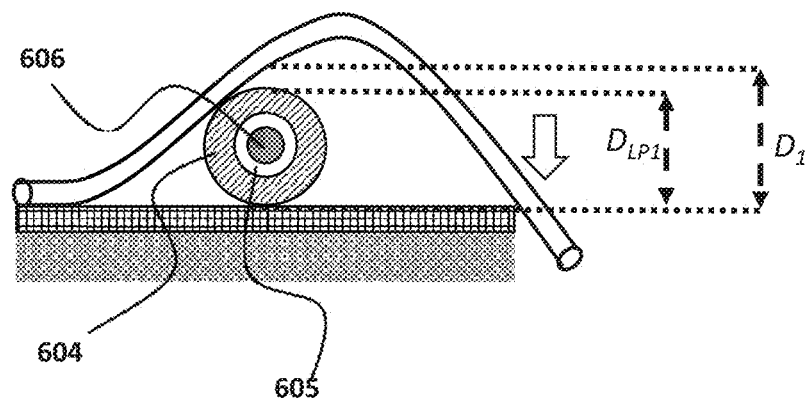

FIG. 6B shows
d.) that a second force, indicated by the arrow, is applied to a second end of the positioning wire 603. This leads to deformation of the first positioning wire 603. The deformation is such that a distance $D_1$ between the first positioning wire 603 and the first conducting region 602 is larger than a distance $D_{LP1}$;
e.) a first longitudinal portion of a conducting wire is placed between the first conducting region 602 and the first positioning wire 603. An outer layer 604 of the first longitudinal portion is placed in electrical contact with, as well as touching the first conducting region 602. The first longitudinal portion also has an inner metal core 606 and an intermediate layer 605.

Figure 6C:
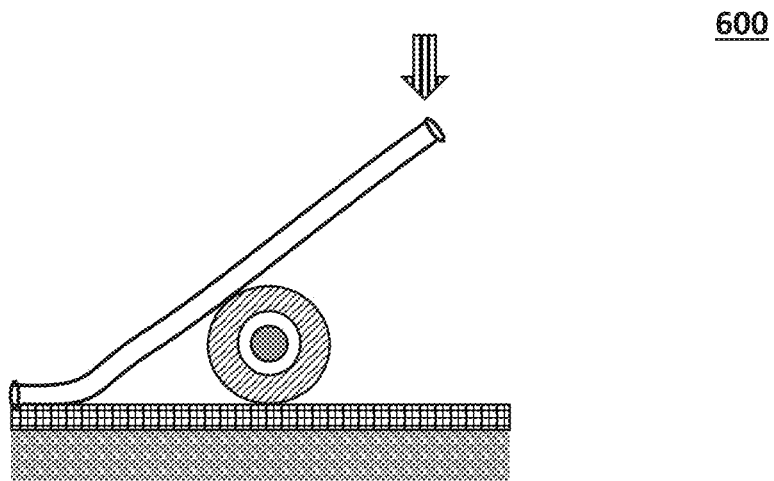

FIG. 6C shows f.) that the second force has been removed. As a result, the first positioning wire 603 tries to regain the shape it had prior to the application of the second force. The first positioning wire 603 is brought into electrical contact with, and touches the outer layer 604. Here $D_1 < D_{LP1}$ still holds;

g.) a third force, indicated by the striped arrow, is applied to a second end of the first positioning wire 603.

Figure 6D:
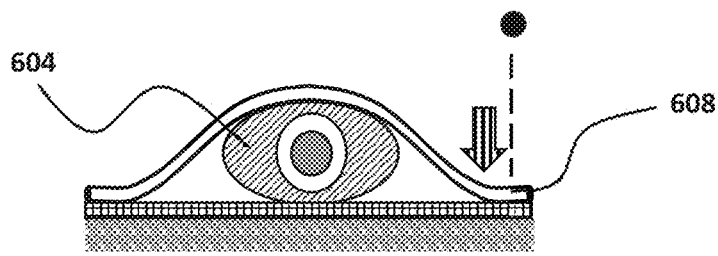

FIG. 6D shows h.) that the third force further deforms the first positioning wire 603. The further deformation decreases $D_1$ such that $D_1 < D_{LP1}$. As a result, the outer layer 604 is deformed;

i.) a second end of the first positioning wire 603 is secured to the first conducting region 602 at a second connection point 608.

j.) the third force is removed.

Figure 7A:
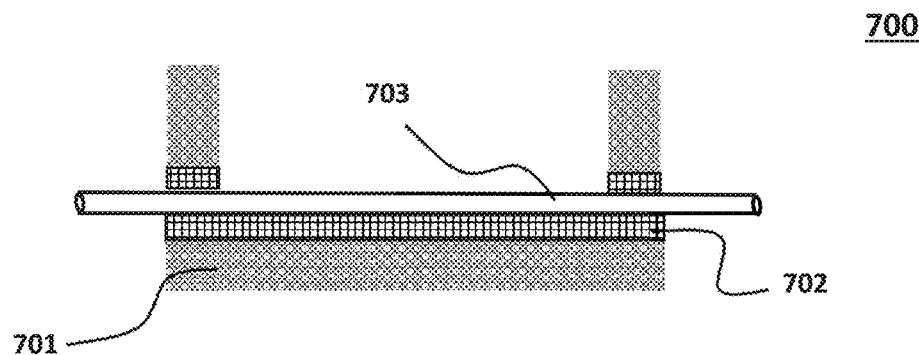
FIGS. 7A-7C show a fifth example method for producing a connection unit. Shown is a cross-sectional cut of the connection unit.
Figure 8A:
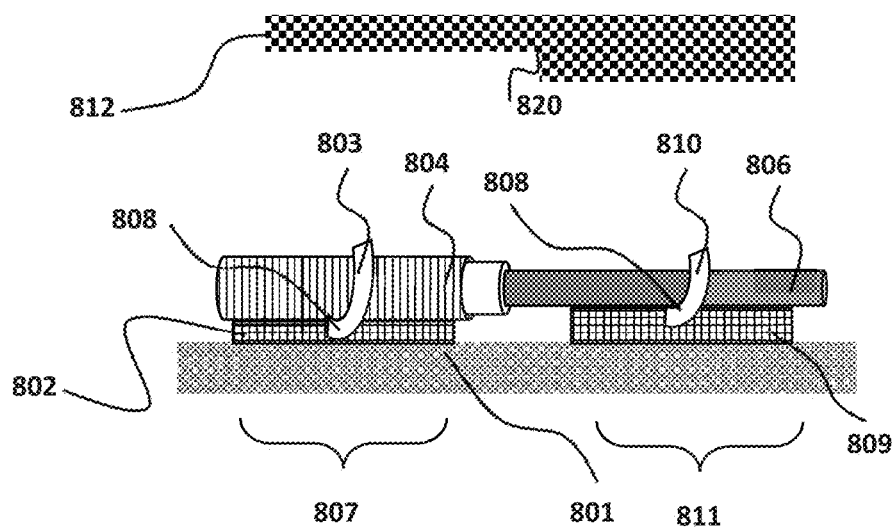
FIG. 8A is a side view of a connection unit.

FIG. 7A shows a.) that a substrate with an insulating layer 701 is provided. Two holes are machined through the substrate;

b.) the substrate, including the machined holes, is metal plated to form a first conducting region 702;

c.) a first positioning wire 703 is threaded through the holes in the substrate.

Figure 7B:
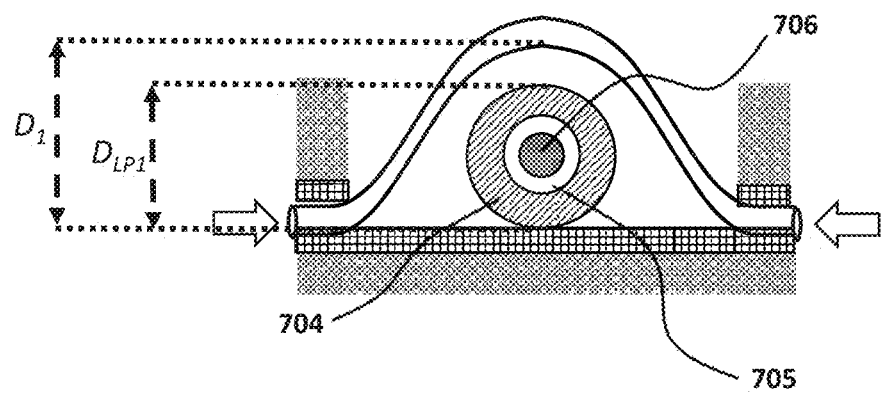

FIG. 7B shows d.) that a first force, indicated by the arrows, is applied to the ends of the first positing wire 703. As a result, the first positioning wire 703 is deformed such that a distance $D_1$ between the first positioning wire 703 and the first conducting region 702 is larger than a distance $D_{LP1}$;

e.) In the next step, a first longitudinal portion of a conducting wire is placed between the first conducting region 702 and the first positioning wire 703. The first longitudinal portion has an outer layer 704 that is brought into electrical contact with, as well as toughing the first conducting region 702. The first longitudinal portion also has an intermediate layer 705 and an inner metal core 706.

Figure 7C:
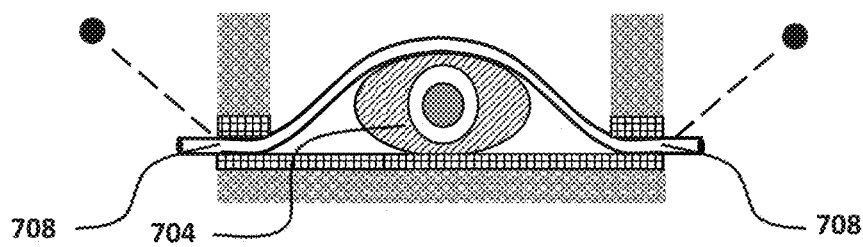

FIG. 7C shows f.) that the first force is removed. This leads to the first positioning wire trying to recover the shape it had prior to the application of the first force. As a result, $D_1$ decreases such that $D_1 < D_{LP1}$. The outer layer 704 is also deformed;

g.) the first positioning wire is secured to the first conducting region at the connection points 708.

FIG. 8A shows a side view of a connection unit. The connection unit has an insulating layer 801, as well as a first conducting region 802. FIG. 8A further shows a conducting wire that has a first longitudinal portion 807 consisting of an outer layer 804, an intermediate layer (not shown), and an inner metal core (not shown). The first longitudinal portion 807 is in electrical contact with, as well as touching, the first conducting region 802. FIG. 8A also shows a first positioning wire 803 that touches the first longitudinal portion 807, as well as being in contact with the first longitudinal portion 807.

FIG. 8A further shows a second conducting region 809, as well as a second longitudinal portion 811. The second longitudinal portion 811 consists of only the metal core 806. The second longitudinal portion is in electrical contact with both, as well as touching both, the second conducting region 809 and a second positioning wire 810. FIG. 8A also shows that the first positioning wire 803 and the second positioning wire 810 are secured to the first conducting region 802 and the second conducting region 809, respectively, at the connection points 808. FIG. 8A also shows a press tool 812. The surface of the press tool 812 that comes into contact with the first positioning wire and the second positioning wire has a step 820. The step 820 allows the press tool to simultaneously exert a force on the first longitudinal portion and the second longitudinal portion.

Figure 8B:
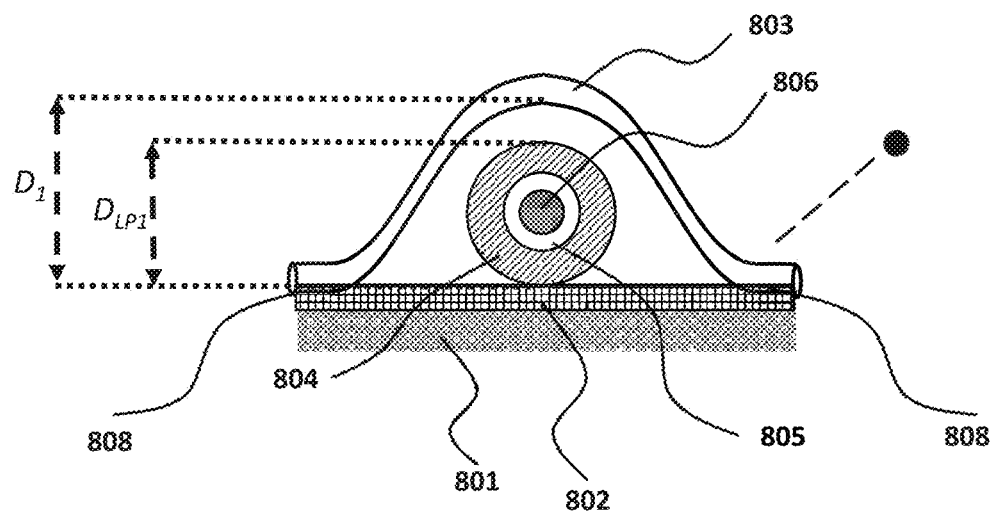
FIG. 8B-8E shows a sixth example method for producing a connection unit. Shown is a cross-sectional cut of the connection unit.

FIG. 8B shows a.) that a substrate with an insulating layer 801 is provided. The substrate also has a first conducting region 802;

b.) a first positioning wire 803 is secured to the first conducting region 802 at the connection points 808. A distance $D_1$ between the first positioning wire 803 and the first conducting region 802 is more than a distance $D_{LP1}$.

c.) a first longitudinal portion of a conducting wire is placed between the first conducting region 802 and first positioning wire 803, so that an outer layer 804 of the first longitudinal portion is in electrical contact with, as well as touching the first conducting region 802. The first longitudinal portion also has an inner metal core 806, surrounded by an intermediate layer 805.

Figure 8C:
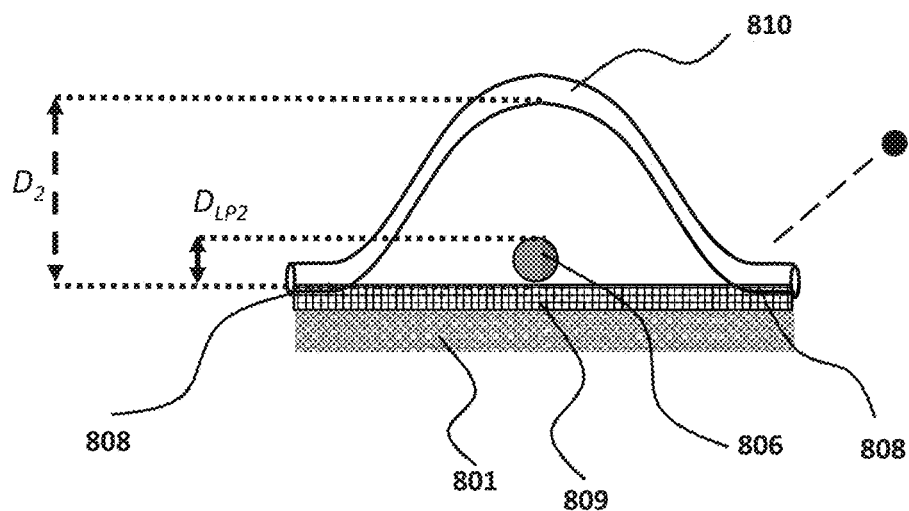

FIG. 8C shows d.) that the substrate also has a second conducting region 809;

e.) a second positioning wire 810 is secured to the second conducting region 809 at the connection points 808. A distance $D_2$ between the second positioning wire 810 and the second conducting region 809 is more than the thickness $D_{LP2}$ of the inner metal core 806.

f.) a second longitudinal portion of the conducting wire is placed between the second conducting region 809 and second positioning wire 810. The second longitudinal portion consists of only the inner metal core 806. The inner metal core 806 of the second longitudinal portion is in electrical contact with, as well as touching the second conducting region 809.

Note that the steps a.) to c.) can be performed prior, simultaneously, of after the steps d.) to f.) have been performed.

Figure 8D:
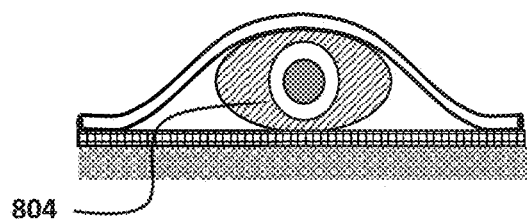

FIG. 8D shows g.) that a second force has been applied to the first positioning wire 803 by a press tool with a step, thereby deforming the positioning wire 803. The deformation leads to a decrease in $D_1$ so that $D_1 < D_{LP1}$. As a result, the first positioning wire 803 is brought in electrical contact with, as well as touching the outer layer 804. The aforementioned decrease is such that the outer layer 804 is deformed.

Figure 8E:
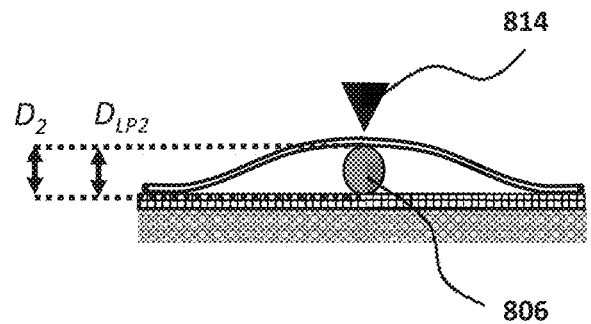

FIG. 8E shows h.) that the second force has been applied to the second positioning wire 810 by the press tool with a step, thereby deforming the positioning wire 810. The deformation leads to a decrease in $D_2$ so that $D_2$ is equal to the thickness $D_{LP2}$ of the inner metal core 806. As a result, the second positioning wire 810 is brought in electrical contact with, as well as touching the inner metal core 806;

i.) the second positioning wire is welded to the second longitudinal portion using a welding tool 814.

Note that step g.) can be performed prior to, simultaneously with, or after step h.). Furthermore step i.) can be performed simultaneously with, or after step h.). It should also be noted that the press tool does not have to move in a direction that is perpendicular to the substrate 801 when deforming the first positioning wire and the second positioning wire. It is also possible for the press tool to move in a direction that makes an angle α with the substrate, where α<90°.

Figure 9A:
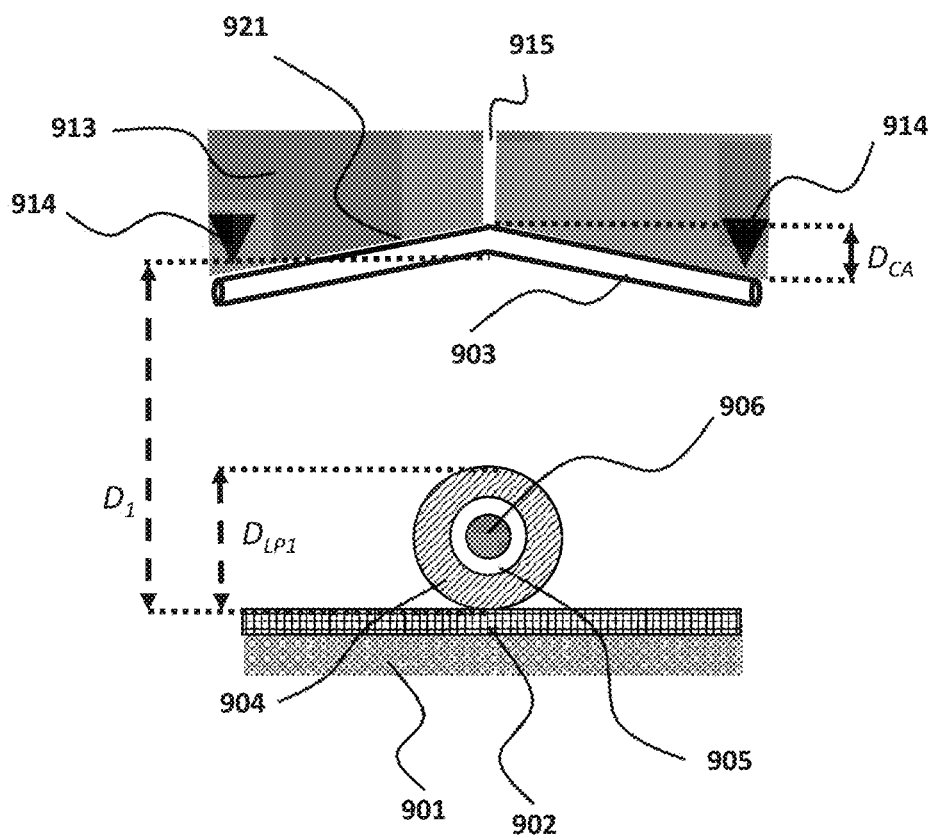
FIGS. 9A-9B is a seventh example method for producing a connection unit. Shown is a cross-sectional cut of the connection unit.
Figure 10:
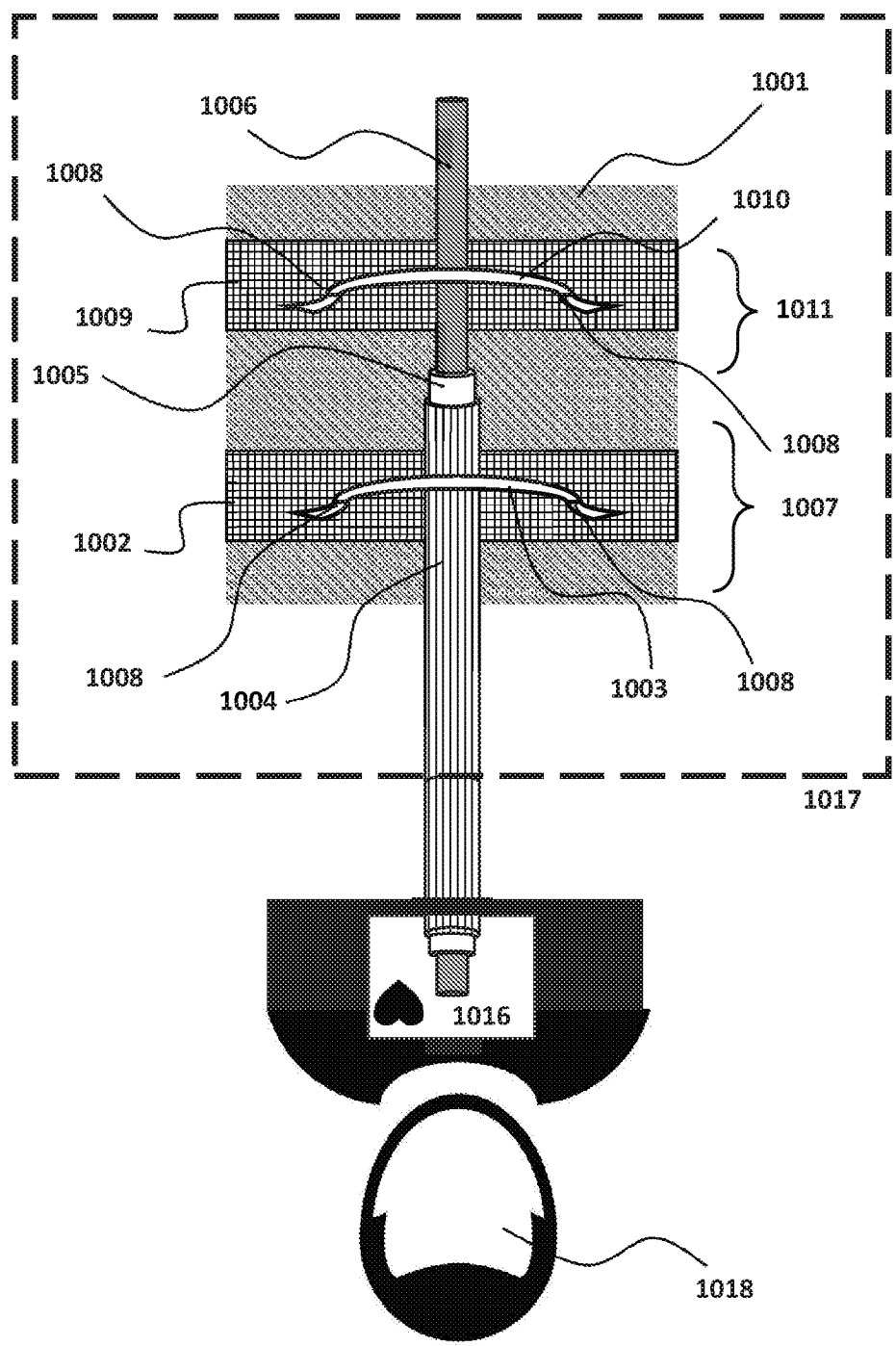
FIG. 10 shows a use of a connection unit in a continuous glucose monitor.

FIG. 9A shows a.) that a substrate with an insulating layer 901 is provided. The substrate also has a first conducting region 902;

b.) a first positioning wire 903 is picked up by a holding tool 913 that is also capable of resistance welding at the two welding points 914. The surface 921 of the holding tool 913 that picks up the first positioning wire 903 has been cut away such that a distance $D_{CA}<D_{LP1}$. This allows the first longitudinal portion to at least partially fit in the cut-away when the first positioning wire 903 that is held by the holding tool 913 is brought to touch the first longitudinal portion. A distance $D_1$ between the first positioning wire 903 and the first conducting region 902 is such that $D_1>D_{LP1}$.

c.) the holding tool has a vacuum channel 915 arranged and adapted to create a vacuum, thereby deforming the first positioning wire 903 to fit the cut-away;

d.) a first longitudinal portion of a conducting wire is placed between the first conducting region 902 and first positioning wire 903, so that an outer layer 904 of the first longitudinal portion is in electrical contact with, as well as touching the first conducting region 902. The first longitudinal portion also has an inner metal core 906, surrounded by an intermediate layer 905.

Note that the first longitudinal portion can be placed in electrical contact with, as well as touching the first conducting region 902 prior, or simultaneously with the first positioning wire 903 being picked by the holding tool 913. If the holding tool 913 does not create a vacuum, the first positioning wire 903 will be deformed when the holding tool 913 is brought towards the first longitudinal portion, and the first positioning wire 903 comes into contact with the first longitudinal portion.

Figure 9B:
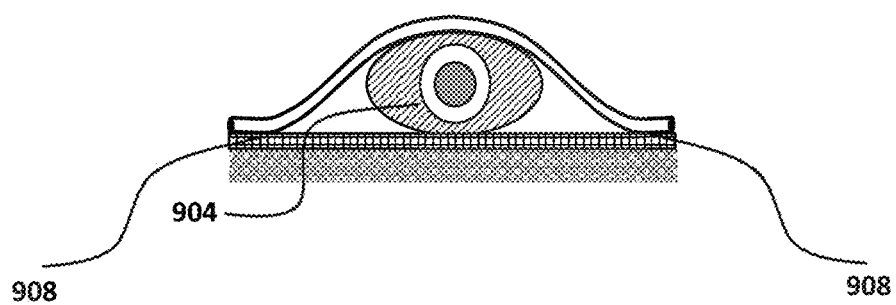

FIG. 9B shows e.) that the holding tool 913 has been moved towards the outer layer 904, thereby decreasing $D_1$. The decrease is such that $D_1<D_{LP1}$. The first positioning wire 903 is brought in electrical contact with, as well as touching the outer layer 904. The first positioning wire 903 is also embedded in the outer layer 904. The outer layer 904 is also deformed;

f.) The first positioning wire 903 is secured to the first conducting region 902 at two connection points 908 using the welding points 914;

g.) the holding tool releases the first positioning wire 903, and moves away from the connection unit.

In the examples of FIGS. 3 through 9, after the first positing wire has been secured at two connection points, the first positing wire can optionally be shortened by removing a section of each of the ends of the first longitudinal portion.

FIG. 10 shows the use of a connection unit in a continuous glucose monitor. FIG. 10 shows an insulating layer 1001 of the substrate, as well as a first conducting region 1002. FIG. 10 further shows a first longitudinal portion 1007 that consists of an outer layer 1004, an intermediate layer (not shown), and an inner metal core (not shown). The first longitudinal portion 1007 is in electrical contact with, as well as touching, the first conducting region 1002. FIG. 10 also shows a first positioning wire 1003 that touches the first longitudinal portion 1007, as well as being in contact with the first longitudinal portion 1007.

FIG. 10 further shows a second conducting region 1009, as well as a second longitudinal portion 1011. The second longitudinal portion 1011 consists of only the metal core 1006. The second longitudinal portion is in electrical contact with both, as well as touching both, the second conducting region 1009 and a second positioning wire 1010. FIG. 10 also shows that the first positioning wire 1003 and the second positioning wire 1010 are secured to the first conducting region 1002 and the second conducting region 1009, respectively, at the connection points 1008.

FIG. 10 further shows that an end of the conducting wire is inserted into a patient 1018. The outer layer 1004 and the inner metal core 1006 that are inside the patient 1018 act as an electrode 1016 for taking measurements of blood glucose levels. FIG. 10 also shows that the connection unit is used in the main body 1017 of the continuous glucose monitor.

Test Methods

Unless otherwise stated, all test methods are performed at a temperature of 25° C. and a pressure of 101325 Pa.

Weight Percentage

These are determined by quantitative analytical methods. E.g. gas chromatography, gravimetry, elementary analysis or the like.

Electrical Conductivity

Electrical conductivity is measured according to the standard ASTM B193-16.

Length

Length, thickness, and width is measured according to the standard ISO 3611:2010.

Young's Modules

Young's modulus is measured according to the standard ASTM E111-17.

Force

Force is measured according to the standard ISO 376: 2011

Layer Integrity

The integrity of the connection unit is assessed by measuring the breakdown voltage between the outer layer and the inner metal core. A decrease in the value indicates a decrease in the layer integrity. For both the outer layer and the connection unit, measurements are taken prior to, as well as after the outer layer is brought in electrical contact with, and touching the conductive region of the substrate.

Durability

A 1000 connection units is placed, one at a time, in a machine that shakes the connection unit at a frequency of 1000 Hz for a duration of 5 minutes. If the outer layer of the first longitudinal portion is still touching the substrate, the connection unit is deemed durable. The number of durable connection units are counted to obtain the durability.

Takt Time

The takt time is the average time between the start of production of one connection unit and the start of production of the next connection unit. The average takt time is measured by producing 1000 connection units.

Reliability 10 continuous glucose monitors (CGM) are used, wherein each CGM has 1000 connection units of the same type. The 10 CGM are used, in turn, to measure the glucose levels of a patient within a 10-minute period. The measurements using the 10 CGM are performed 6 times. The reliability is a measure of the variance of the measurements. A larger variance means less reliability, and a smaller variance means a higher reliability.

EXAMPLES

The present invention is now exemplified by means of non-limiting examples.

For all of the examples below, the following applies: a 1 mm thick FR4 (fibre reinforced epoxy resin of flame-retardant category 4) substrate is provided. The FR4 substrate has a glass-reinforced epoxy laminate insulating layer, as well as a first conducting region.

For all of the examples below, the following applies: a conducting wire that has a first longitudinal portion is provided. The first longitudinal portion has an inner metal core that consists of platinum clad tantalum. The thickness of the inner metal core is 100 µm. An intermediate layer of polyurethane surrounds the inner metal core, wherein the thickness of the intermediate layer is 25 µm. The intermediate layer is surrounded by a 15 µm thick outer layer. The outer layer comprises polyurethane, silver and silver chloride. The thickness of the first longitudinal portion is 180 µm.

For all of the example below, the following is also applicable: when a conducting wire is placed between a first positioning wire and a first conducting region, a first longitudinal portion of the conducting wire partially overlaps with the first conducting region. The first longitudinal portion is in electrical contact with, as well as touching the first conducting region. The first positioning wire is also transverse to the first longitudinal portion.

Example 1

Two holes are machined through a substrate. The holes are 3 mm apart, 250 µm in diameter, and are machined at an angle of 15° with respect to a first (upper) surface of the substrate. The surfaces confining the holes are electroless nickel immersion gold (ENIG) plated, thereby forming an electrical contact between the surfaces confining the holes and first conducting region.

A first positioning wire with a thickness of 200 µm is threaded through the two holes in the substrate in such a way that the first positioning wire forms a loop above the first surface of the substrate. The first positioning wire comprises an age hardened nickel-cobalt alloy. A distance $D_1$ between the first positioning wire and the first conducting region is 230 µm. Furthermore, the first positioning wire is in electrical contact with the first conducting region. A conducting wire is placed between the first positioning wire and the first conducting region.

A second force of 5N is applied on the loop of the first positioning wire, thereby leading to $D_1$ decreasing such that $D_1$=170 µm. The first positioning wire is partially embedded in the outer layer, leading to a deformation of the outer layer. Furthermore, the decrease in $D_1$ results in the first positioning wire being in electrical contact with the outer layer. The two ends of the first positioning wire that protrude from a second (lower) surface of the substrate are laser welded to the substrate to secure the first positioning wire. The press tool is lifted.

Example 2

Two opposite edges of a substrate is machined so that the edges slant by an angle of 3° with respect to a first (upper) surface of the substrate. A first conducting region partially covers the substrate, including both of the slanted edges.

A first end of a first positioning wire is resistance welded to the first slanted edge of substrate. The first positioning wire is in electrical contact with the first conducting region. Furthermore, the first positioning wire has a thickness of 200 µm. The first positioning wire comprises an age hardened nickel-cobalt alloy. A distance $D_1$ between the first positioning wire and the first conducting region is 230 µm. A conducting wire is placed between the first positioning wire and the first conducting region. The first longitudinal portion is also placed 1.5 mm from the first slanted edge.

A second force of 5N is applied on a second end of the first positioning wire. The second force is used to bring the second end and the second slanted edge of the substrate in touch with each other, thereby leading to $D_1$ decreasing such that $D_1$=170 µm. The first positioning wire is partially embedded in the outer layer, leading to a deformation of the outer layer. Furthermore, the decrease in $D_1$ results in the first positioning wire being in electrical contact with the outer layer. The second end of the first conducting wire is resistance welded to the part of the first conducting region that covers the second slanted edge. The press tool is lifted.

Example 3

A substrate is provided. A first positioning wire is placed parallel to the first conducting region so that the first positioning wire and the first conducting region touch each other. A first end of the first positioning wire is resistance welded to the first conducting region at a first connection point. The first positioning wire is in electrical contact with the first conducting region. Furthermore, the first positioning wire has a thickness of 200 µm. The first positioning wire comprises an age hardened nickel-cobalt alloy.

A first force of 5N is applied on a second end of the first positioning wire. This partially deforms the first positioning wire, thereby creating a distance $D_1$ between the first positioning wire and the first conducting region that is 230 µm. A conducting wire is placed between the first positioning wire and the first conducting region.

The press tool is removed, and the first positioning wire tries to regain the shape it had prior to the application of the first force. As a result, a section of the first positioning wire is in electrical contact with, as well as touching the outer layer. A third force of 5N is applied on the second end of the first positioning wire. The third force is used to bring the second end of the first positioning wire and the first conducting region in touch with each other. The distance $D_1$ is decreased by the application of the third force such that $D_1$=170 µm. The first positioning wire is partially embedded in the outer layer, leading to a deformation of the outer layer. Furthermore, the decrease in $D_1$ results in the first positioning wire being in electrical contact with the outer layer. The second end of the first conducting wire is resistance welded to the first conducting region at a second connection point. The press tool is lifted.

Example 4

Two holes are machined through a substrate. The holes are 3 mm apart, 220 µm in diameter, and are machined in a direction that is parallel to a first (upper) surface of the first conducting region. The surfaces confining the holes are electroless nickel immersion gold (ENIG) plated, thereby forming an electrical contact between the surfaces confining the holes and first conducting region.

A first positioning wire with a thickness of 200 µm is threaded through the two holes in the substrate in such a way that the first positioning wire is parallel to the first conducting region.

The first positioning wire touches the first conducting region, as well as being in contact with the first conducting region. The first positioning wire comprises an age hardened nickel-cobalt alloy.

A first force of 5N is applied on the ends of the first positioning wire. This first force deforms the first positioning wire such that a distance $D_1$ between the first positioning wire and the first conducting region is 230 μm. A conducting wire is placed between the first positioning wire and the first conducting region.

The press tool is lifted, and the first positioning wire tries to regain the shape it had prior to the application of the first force. As a result, a section of the first positioning wire is in electrical contact with, as well as touching the outer layer. This leads to $D_1$ decreasing such that $D_1$=170 μm. The first positioning wire is partially embedded in the outer layer, leading to a deformation of the outer layer. The two ends of the first positioning wire that protrude through the machined holes of the substrate are laser welded to the substrate to secure the first positioning wire.

Example 5

A substrate is provided. The substrate has a first conducting region and a second conducting region. The first conducting region and the second conducting region are both gold ribbons with a width of 0.7 mm and a length of 3 mm.

A first positioning wire consisting of aluminium is wedge-to-wedge bonded to the first conducting region at two connection points. The first positioning wire is in electrical contact with the first conducting region. Furthermore, the first positioning wire has a thickness of 200 μm. The first positioning wire is connected to the first conducting region in such a way that the first positioning wire forms a loop above a first (upper) surface of the substrate. A distance $D_1$ between the first positioning wire and the first conducting region is 250 μm.

A second positioning wire consisting of aluminium is bonded to the second conducting region at two connection points. The second positioning wire is in electrical contact with the second conducting region. Furthermore, the second positioning wire has a thickness of 200 μm. The second positioning wire is connected to the second conducting region in such a way that the second positioning wire forms a loop above the first surface of the substrate. A distance $D_2$ between the second positioning wire and the second conducting region is 250 μm.

A conducting wire is placed between the first positioning wire and the first conducting region. Furthermore, the conducting wire is also placed between the second positioning wire and the second conducting region such that a second longitudinal portion of the conducting wire partially overlaps with the second conducting region. The second longitudinal portion is in electrical contact with, as well as touching the second conducting region. The second positioning wire is also transverse to the second longitudinal portion. The second longitudinal portion consists of only the inner metal core.

A first force of 5N is applied on both the first positioning wire and the second positioning wire. The first longitudinal portion is deformed, thereby decreasing $D_1$ such that $D_1$=170 μm. The first positioning wire is partially embedded in the outer layer, leading to a deformation of the outer layer. Furthermore, the decrease in $D_1$ results in the first positioning wire being in electrical contact with the outer layer. The first force also deforms the second positioning wire so that $D_2$ is reduced to $D_2$=100 μm. The second positioning wire is in electrical contact with, as well as touching the second longitudinal portion. The second positioning wire is resistance welded to the second longitudinal portion. The press tool is lifted.

Example 6

A substrate is provided. The substrate has a first conducting region and a second conducting region. The first conducting region and the second conducting region are both gold ribbons with a width of 0.7 mm and a length of 3 mm.

A first positioning wire consisting of gold is wedge-to-wedge bonded to the first conducting region at a first connection point. The first positioning wire is in the shape of a ribbon. The thickness of the first positioning wire is 25 μm, while the width of the first positioning wire is 250 μm. The first positioning wire is in electrical contact with the first conducting region. The first positioning wire is connected to the first conducting region in such a way that the first positioning wire forms a loop above a first (upper) surface of the substrate. A distance $D_1$ between the first positioning wire and the first conducting region is 250 μm.

A second positioning wire consisting of gold is bonded to the second conducting region at a second connection point. The second positioning wire is in electrical contact with the second conducting region. Furthermore, the second positioning wire has a thickness of 250 μm. The second positioning wire is connected to the second conducting region in such a way that the second positioning wire forms a loop above the first surface of the substrate. A distance $D_2$ between the second positioning wire and the second conducting region is 250 μm.

A conducting wire is placed between the first positioning wire and the first conducting region. Furthermore, the conducting wire is also placed between the second positioning wire and the second conducting region such that a second longitudinal portion of the conducting wire partially overlaps with the second conducting region. The second longitudinal portion is in electrical contact with, as well as touching the second conducting region. The second positioning wire is also transverse to the second longitudinal portion. The second longitudinal portion consists of only the inner metal core.

A first force of 5N is applied on both the first positioning wire and the second positioning wire. The first longitudinal portion is deformed, thereby decreasing $D_1$ such that $D_1$=170 μm. The first positioning wire is partially embedded in the outer layer, leading to a deformation of the outer layer. Furthermore, the decrease in $D_1$ results in the first positioning wire being in electrical contact with the outer layer. The first force also deforms the second positioning wire so that $D_2$ is reduced to $D_2$=100 μm. The second positioning wire is in electrical contact with, as well as touching the second longitudinal portion.

The second positioning wire is resistance welded to the second longitudinal portion. The first positioning wire is resistance welded to the first conducting region at a third connection point. The second positioning wire is resistance welded to the second conducting region at a fourth connection point. The press tool is lifted.

Example 7

A substrate is provided. The substrate has a first conducting region and a second conducting region. The first conducting region and the second conducting region are both gold ribbons with a width of 0.7 mm and a length of 3 mm.

A press tool that can apply a suction force is used to pick up a first positioning wire, as well as a second positioning wire. For both the first positioning wire and the second positioning wire, the following applies: a.) comprises gold, b.) is in the shape of a ribbon, c.) thickness of 25 µm, and d.) a width of 250 µm. A distance $D_1$ between the first positioning wire and the first conducting region is 250 µm. A distance $D_2$ between the second positioning wire and the second conducting region is 250 µm.

A conducting wire is placed between the first positioning wire and the first conducting region. Furthermore, the conducting wire is also placed between the second positioning wire and the second conducting region such that a second longitudinal portion of the conducting wire partially overlaps with the second conducting region. The second longitudinal portion is in electrical contact with, as well as touching the second conducting region. The second positioning wire is also transverse to the second longitudinal portion. The second longitudinal portion consists of only the inner metal core.

The press tool is moved towards the substrate. The first positioning wire is brought in electrical contact with, as well as touching the first longitudinal portion. Furthermore, $D_1$ is decreased such that $D_1=170$ µm. The first positioning wire is partially embedded in the outer layer, leading to a deformation of the outer layer. The second positioning wire is brought in electrical contact with, as well as touching the second longitudinal portion. Furthermore, $D_2$ is decreased such that $D_2=100$ µm.

The second positioning wire is resistance welded to the second longitudinal portion. The first positioning wire is resistance welded to the first conducting region at two connection points.

The second positioning wire is resistance welded to the second conducting region at two connection points. The press tool is lifted.

Example 8

Example 8 is a repeat of Example 1, with the difference that the outer layer of the conducting wire consists of the electrically conducting polymer PEDOT PSS commercially available from Heraeus Deutschland GmbH, Germany, under the tradename Clevios®. The method is executed as described in Example 1, with the only difference in results being that the first longitudinal portion is deformed such that $D_1=165$ µm.

Example 9

The performance of connection units are compared with each other. The connection units are produced according to Example 1, with the difference that various connection means are used to achieve the electrical contact between the electrically conducting, polymer coated wire and the electrically conducting substrate, as well as simultaneously achieving the touching between the electrically conducting, polymer coated wire and the electrically conducting substrate. The following connection means were used
   a.) 1000 connection units are produced using the wire bonding of Example 1;
   b.) 1000 connection units are produced using a conductive adhesive;
   c.) 1000 connection units are produced using soldering.
The performance indicators that were measured are
   a.) the increase in electrical conductivity in the connection unit (conductivity);
   b.) decrease in damage to the electrically conducting polymer layer (layer integrity);
   c.) durability of the connection unit (durability);
   d.) the time needed to produce a connection unit (takt time);
   e.) the reliability of the connection unit when the connection units are used in a continuous glucose monitor (reliability);
   f.) the number of process steps and tools needed to produce the connection unit (complexity);
   g.) the amount of energy needed to produce a connection unit (energy consumption);
   h.) the amount of material needed to produce the connection unit (material).

Table 1 shows the results of the experiment. The performance of the various connection means are ranked relative to each other, with 1 being the best and 3 being the worse.

TABLE 1

| Properties | Wire bonding | Conductive adhesive | Soldering |
| --- | --- | --- | --- |
| Conductivity | 1 | 2 | 1 |
| Layer integrity | 2 | 1 | 3 |
| Durability | 1 | 2 | 1 |
| Takt time | 1 | 3 | 2 |
| Reliability | 1 | 1 | 1 |
| Complexity | 2 | 1 | 3 |
| Energy consumption | 1 | 2 | 2 |
| Material | 1 | 2 | 2 |

The above table shows that the wire bonding according to the present invention provides in total a better performance over the properties. Conductive adhesive and soldering, however, perform weaker.

REFERENCE LIST

100 Connection unit
101 Insulating layer
102 First conducting region
103 First positioning wire
104 Outer layer
105 Intermediate layer
106 Inner metal core
107 First longitudinal portion
108 Connection points
109 Second conducting region
110 Second positioning wire
111 Second longitudinal portion
200 Method for producing a connection unit
231 Provide first positioning wire, substrate and conducting wire
232 Arrange first positioning wire, substrate and conducting wire
233 Reduce distance between first positioning wire and substrate
234 Provide second positioning wire
235 Arrange second positioning wire, substrate and conducting wire
300 First example method for producing a connection unit
301 Insulating layer
302 First conducting region
303 First positioning wire
304 Outer layer
305 Intermediate layer
306 Inner metal core
308 Connection points 400 Second example method for producing a connection unit
401 Insulating layer
402 First conducting region
403 First positioning wire
404 Outer layer
405 Intermediate layer
406 Inner metal core
408 Connection points
500 Third example method for producing a connection unit
501 Insulating layer
502 First conducting region
503 First positioning wire
504 Outer layer
505 Intermediate layer
506 Inner metal core
508 Connection points
600 Fourth example method for producing a connection unit
601 Insulating layer
602 First conducting region
603 First positioning wire
604 Outer layer
605 Intermediate layer
606 Inner metal core
608 Connection points
700 Fifth example method for producing a connection unit
701 Insulating layer
702 First conducting region
703 First positioning wire
704 Outer layer
705 Intermediate layer
706 Inner metal core
708 Connection points
800 Connection unit and sixth example method of producing the same
801 Insulating layer
802 First conducting region
803 First positioning wire
804 Outer layer
805 Intermediate layer
806 Inner metal core
807 First longitudinal portion
808 Connection points
809 Second conducting region
810 Second positioning wire
811 Second longitudinal portion
812 Press tool
820 Surface with step
900 Seventh example method for producing a connection unit
901 Insulating layer
902 First conducting region
903 First positioning wire
904 Outer layer
905 Intermediate layer
906 Inner metal core
907 First longitudinal portion
908 Connection points
909 Second conducting region
910 Second positioning wire
911 Second longitudinal portion
913 Holding tool
914 Welding points
915 Vacuum channel
921 Surface with cut-away
1000 Connection unit
1001 Insulating layer
1002 First conducting region
1003 First positioning wire
1004 Outer layer
1005 Intermediate layer
1006 Inner metal core
1007 First longitudinal portion
1008 Connection points
1009 Second conducting region
1010 Second positioning wire
1011 Second longitudinal portion
1016 Electrode of continuous glucose monitor
1017 Main body of continuous glucose monitor
1018 Patient

What is claimed is:

1. A connection unit comprising:
   a.) a substrate, wherein the substrate comprises:
      i. an insulating layer that is electrically insulating, and
      ii. a first conducting region that is electrically conducting;
   b.) a first positioning wire;
   c.) a conducting wire, wherein
      i. the conducting wire comprises a first longitudinal portion,
      ii. in a first cross-sectional cut of the first longitudinal portion, the first cross-sectional cut comprises the following layers, in this order:
         A) an outer layer that is electrically conducting,
         B) an intermediate layer that is electrically insulating,
         C) an inner metal core that is electrically conducting,
         D) the intermediate layer, and
         E) the outer layer;
      iii. the first longitudinal portion is located between the substrate and the first positioning wire, such that
         A) the first longitudinal portion at least partially overlaps the first conducting region,
         B) the first positioning wire is arranged transverse to the first longitudinal portion, and
         C) the first longitudinal portion is in electrical contact with both, and touches both
            I. the first conducting region, and
            II. the first positioning wire;
   and
   wherein, in a second cross-sectional cut of the connection unit, taken at the position of the first longitudinal portion, the second cross sectional cut comprises the following layers, in this order:
   a.) the first positioning wire,
   b.) the first longitudinal portion, and
   c.) the substrate;
   wherein the outer layer comprises at least 10 wt. %, based on the total weight of the outer layer, of an organic material.

2. The connection unit according to claim 1, wherein
   a.) the substrate comprises a second conducting region that is electrically conducting;
   b.) the conducting wire comprises a second longitudinal portion, wherein, in a third cross-sectional cut of the second longitudinal portion, the third cross-sectional cut comprises the inner metal core;
   c.) the connection unit comprises a second positioning wire, and
   d.) the second longitudinal portion is located between the substrate and the second positioning wire, such that A) the second longitudinal portion at least partially overlaps the second conducting region,
B) the second positioning wire is arranged transverse to the second longitudinal portion,
C) the second longitudinal portion is in electrical contact with both, and touches both
   I. the second conducting region, and
   II. the second positioning wire;
and
wherein, in a fourth cross-sectional cut of the connection unit, taken at the position of the second longitudinal portion, the fourth cross sectional cut comprises the following layers, in this order:
a.) the second positioning wire,
b.) the second longitudinal portion,
c.) the substrate.

3. The connection unit according to claim 1, wherein the organic material is a polymer.

4. The connection unit according to claim 1, wherein the organic material is a polymer selected form the group consisting of I.) a mixture comprising an electrically insulating polymer and a plurality of particles that comprises a metal or a metal compound, or a combination thereof, II.) a conductive polymer, or III.) a combination thereof.

5. The connection unit according to claim 1, wherein the outer layer comprises 50 wt. %, based on the total weight of the outer layer, of a metal or a metal compound, or a combination thereof.

6. The connection unit according to claim 1, wherein the outer layer has at least one or all of the following properties:
a.) a thickness in the range of 6 µm to 24 µm;
b.) an electrical conductivity in the range of $10^{-8}$ S/m to $2\times10^{-2}$ S/m; and
c.) a Young's modulus in the range of 0.01 MPa to 100 MPa.

7. The connection unit according to claim 1, wherein the first positioning wire, or a second positioning wire, or both, has, independent of each other, at least one or all of the following properties:
a.) comprises one or more metals;
b.) a thickness in the range of 5 µm to 350 µm;
c.) a length in the range of 0.1 mm to 50 mm; and
d.) an electrical conductivity in the range of $10^4$ S/m to $10^8$ S/m.

8. The connection unit according to claim 1, wherein the first conducting region, or a second conducting region, or both, has, independent of each other, at least one or all of the following properties:
a.) comprises a metal;
b.) has a metal plating finish;
c.) a thickness in the range of 1.5 mm to 4.5 mm;
d.) a length in the range of 0.2 mm to 1.2 mm; and
e.) an electrical conductivity in the range of $10^5$ S/m to $10^{10}$ S/m.

9. An electronic device comprising a further electronic element that is in electrical contact with a connection unit according to claim 1.

10. The electronic device according to claim 9, wherein the electronic device is selected from the group consisting of continuous glucose monitors, electrocardiographs, electromyographs, and electroencephalogram devices.

11. A method for producing a connection unit comprising:
a.) providing a first positioning wire, a substrate, and a conducting wire, wherein
   i. the substrate comprises a first conducting region, and
   ii. the conducting wire comprises a first longitudinal portion, wherein the first longitudinal portion comprises an outer layer;
b.) arranging the first positioning wire, the substrate, and the first longitudinal portion, such that
   i. the first longitudinal portion is located between the substrate and the first positioning wire,
   ii. the first longitudinal portion at least partially overlaps the first conducting region,
   iii. the first positioning wire is transverse to the first longitudinal portion,
   iv. the first longitudinal portion is in electrical contact with both, and touches both
      A) the first conducting region, and
      B) the first positioning wire; and
   v. a distance $D_1$ between the first positioning wire and the substrate is equal to an initial thickness $D_{LP1}$ of the first longitudinal portion; and
c.) reducing the distance $D_1$ between the first positioning wire and the substrate, such that
   i. $D_1<D_{LP1}$,
   ii. the outer layer of the first longitudinal portion is deformed, and
   iii. the first positioning wire exerts a mechanical force on the first longitudinal portion.

12. The method according to claim 11, wherein
a.) the substrate comprises a second conducting region, and
b.) the conducting wire comprises a second longitudinal portion, wherein the second longitudinal portion comprises an inner metal core,
and wherein the method comprises the following steps:
a.) providing a second positioning wire;
b.) arranging the second positioning wire, the substrate, and the second longitudinal portion, such that
   i. the second longitudinal portion is located between the substrate and the second positioning wire,
   ii. the second longitudinal portion at least partially overlaps the second conducting region,
   iii. the second positioning wire is transverse to the second longitudinal portion,
   iv. the second longitudinal portion is in electrical contact with both, and touches both
      A) the second conducting region, and
      B) the second positioning wire; and
   v. a distance $D_2$ between the second positioning wire and the substrate is equal to an initial thickness $D_{LP2}$ of the second longitudinal portion, such that the second positioning wire exerts a mechanical force on the second longitudinal portion.

13. The method according to claim 11, wherein a first force is applied to the first positioning wire, or a second positioning wire, or both.

14. The method according to claim 13, wherein the distance $D_1$, or a distance $D_2$, or both, is reduced by removing the first force.

15. The method according to claim 13, wherein the strength of the first force, or a second force, or both, is, independent of each other, in the range of 0.5 N to 15 N.

16. The method according to claim 11, wherein a second force is applied to the first positioning wire, or a second positioning wire, or both.

17. The method according to claim 16 wherein the distance $D_1$, or a distance $D_2$, or both, is reduced by applying the second force.

18. A connection unit obtainable by a method according to claim 11.

\* \* \* \* \*